(12) United States Patent
Jackson

(10) Patent No.: US 7,451,941 B2
(45) Date of Patent: Nov. 18, 2008

(54) DENSE FLUID SPRAY CLEANING PROCESS AND APPARATUS

(76) Inventor: David P. Jackson, 22328 W. Barcotta Dr., Saugus, CA (US) 91350

( * ) Notice: Subject to any disclaimer, the term of this patent is extended or adjusted under 35 U.S.C. 154(b) by 889 days.

(21) Appl. No.: 10/221,593

(22) PCT Filed: Mar. 13, 2001

(86) PCT No.: PCT/US01/08040

§ 371 (c)(1),
(2), (4) Date: Sep. 12, 2002

(87) PCT Pub. No.: WO01/74538

PCT Pub. Date: Oct. 11, 2001

(65) Prior Publication Data

US 2003/0207655 A1     Nov. 6, 2003

(51) Int. Cl.
*F23D 11/16*     (2006.01)
*F23D 11/10*     (2006.01)

(52) U.S. Cl. .................. 239/423; 239/419; 239/419.5; 239/422

(58) Field of Classification Search ............... 239/398, 239/419, 419.3, 422, 427, 428; 134/1, 1.2, 134/1.3

See application file for complete search history.

(56) References Cited

U.S. PATENT DOCUMENTS

| | | | | |
|---|---|---|---|---|
| 3,965,494 A | * | 6/1976 | Baker | 4/615 |
| 5,062,898 A | * | 11/1991 | McDermott et al. | 134/7 |
| 5,098,123 A | * | 3/1992 | Jones | 280/741 |
| 5,368,171 A | * | 11/1994 | Jackson | 134/147 |
| 5,409,418 A | * | 4/1995 | Krone-Schmidt et al. | 451/75 |
| 5,452,855 A | * | 9/1995 | Keller | 239/135 |
| 5,725,154 A | * | 3/1998 | Jackson | 239/135 |
| 5,788,738 A | * | 8/1998 | Pirzada et al. | 75/331 |
| 6,558,622 B1 | * | 5/2003 | Malchesky | 422/28 |

FOREIGN PATENT DOCUMENTS

DE     4122864 A1 *   1/1993
EP     712691 A1 *    5/1996

* cited by examiner

*Primary Examiner*—Davis D Hwu
(74) *Attorney, Agent, or Firm*—DuFault Law Firm, P.C.; Dustin R. DuFault

(57) ABSTRACT

Disclosed is a dense fluid spray cleaning apparatus comprising a gas supply (3) for providing a predetermined amount of a gas to an enhanced joule-thompson condensation reactor (2) and for providing gas to a propellant generator (4), a premix chamber (6) for receiving a solid particulate from the enhanced joule thompson condensation reactor and heated gas from the propellant generator, and a mixing chamber (8) for receiving the solid particulate and the heated gas and producing a spray stream containing the solid particulate.

13 Claims, 23 Drawing Sheets

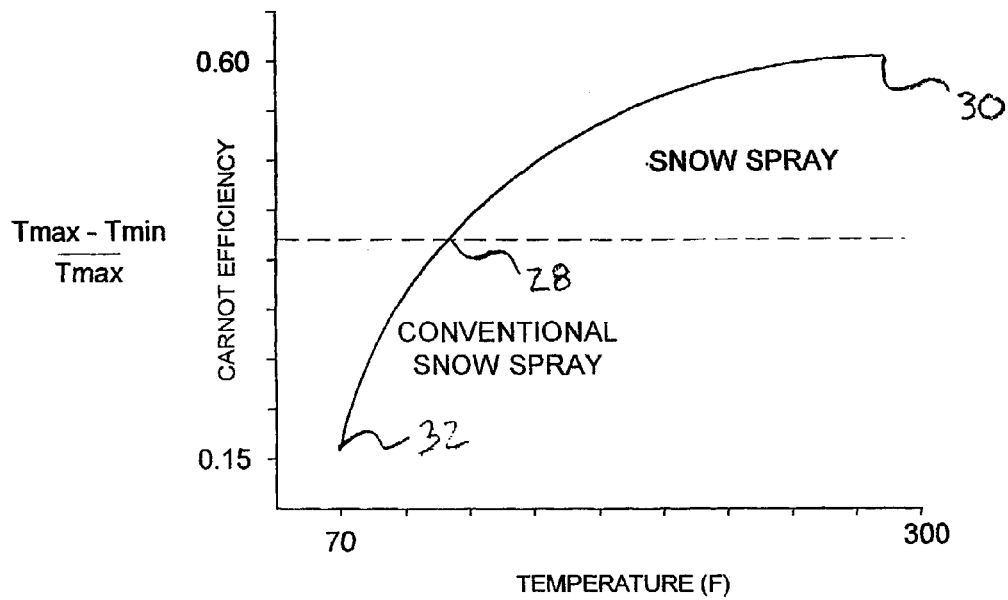
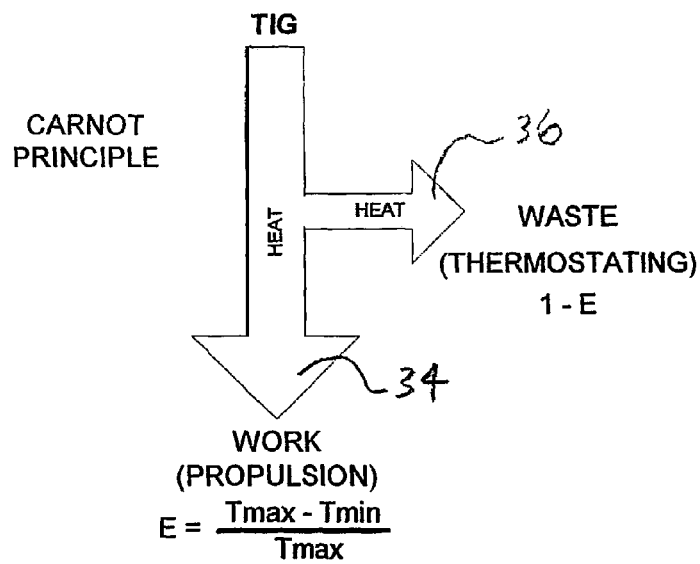
FIG 1F

VARIABLES
FLOWRATE
TEMPERATURE
PRESSURE
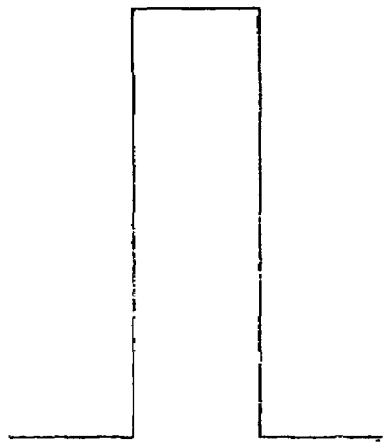
ENVIRONMENTAL CONTROL
THERMOSTATTING
AMBIENT INERTING
FIG 1H

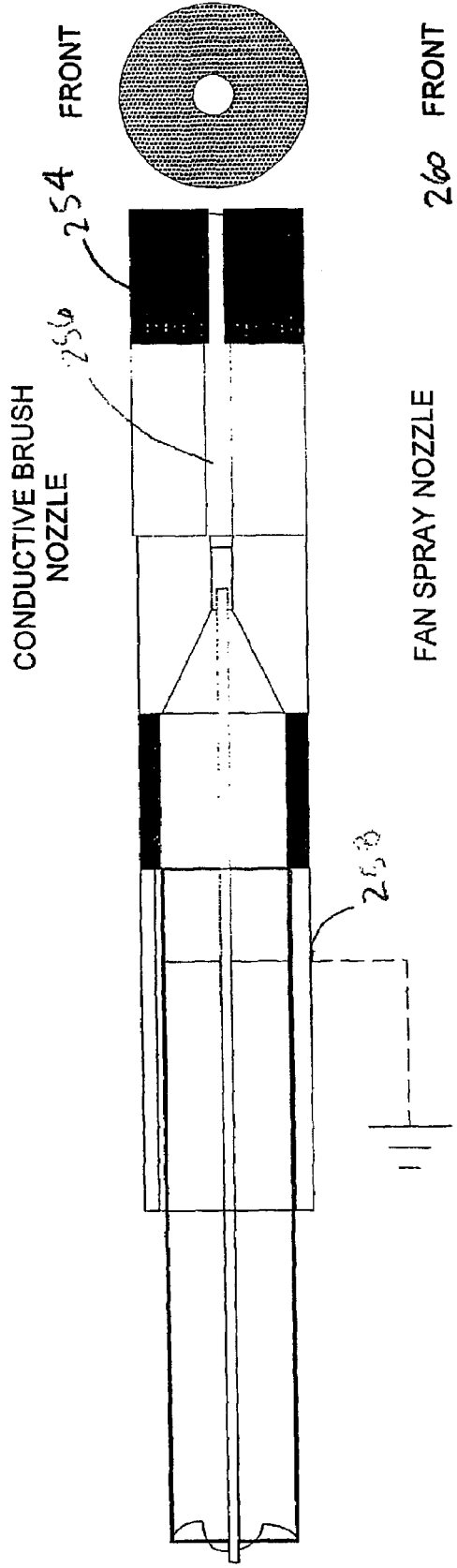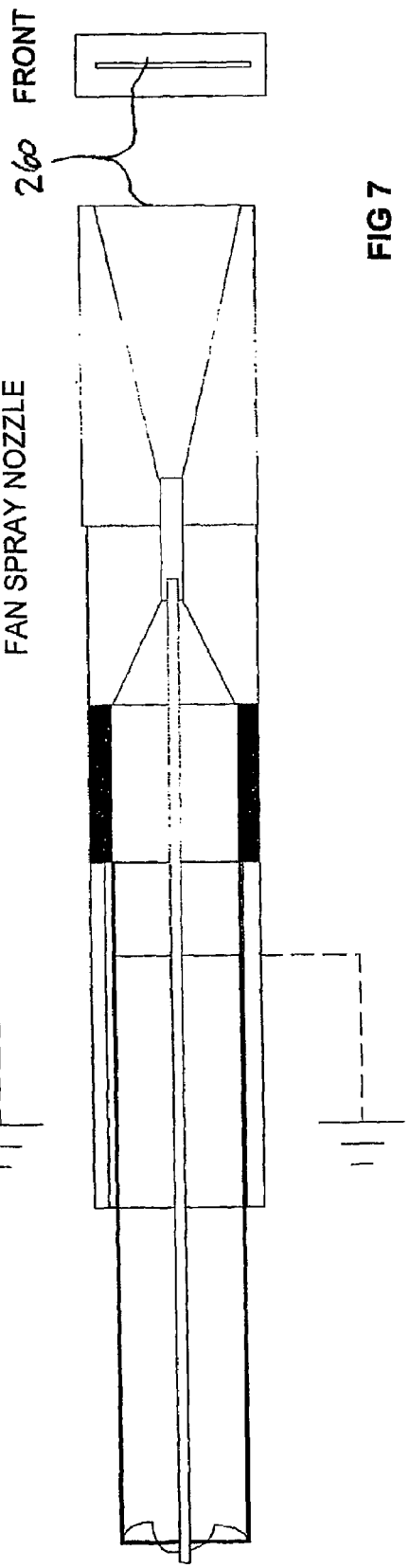

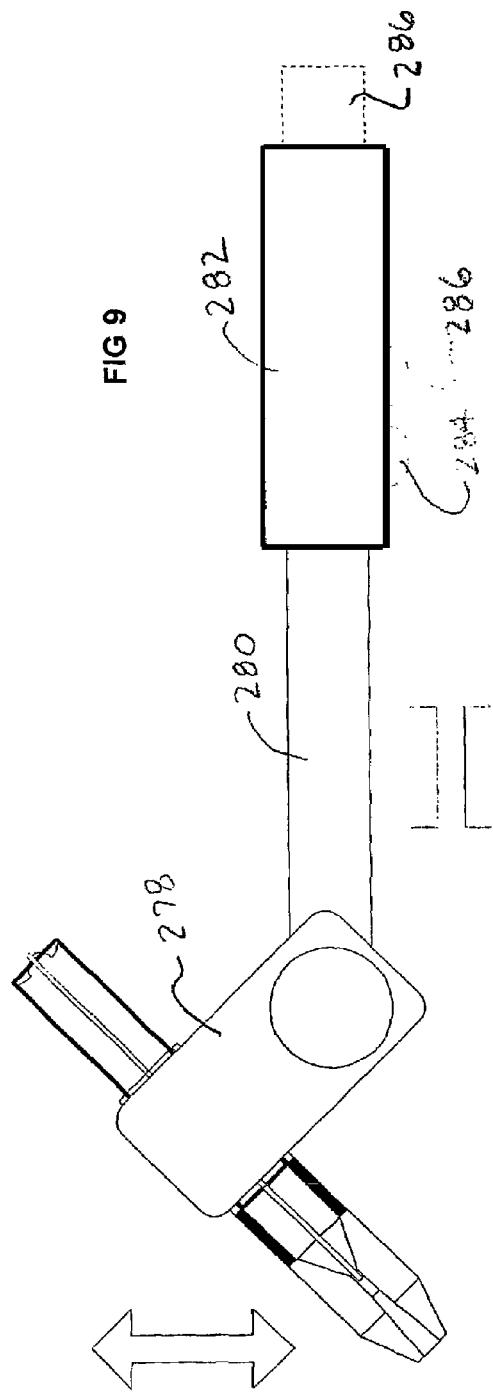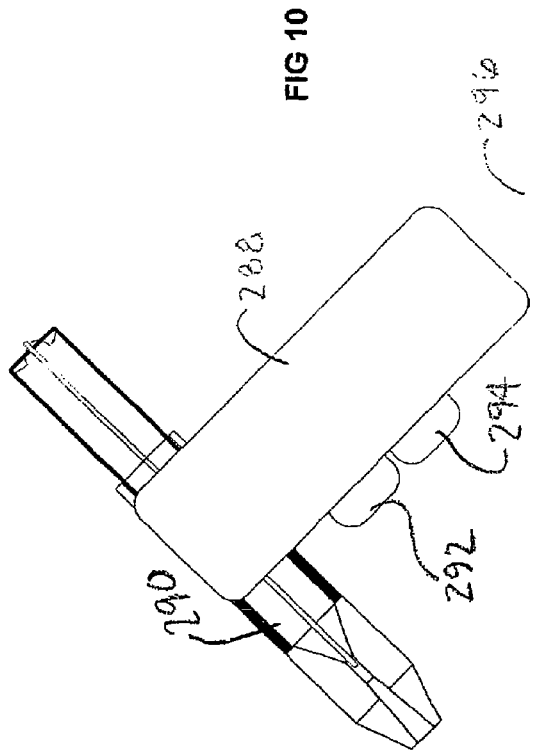

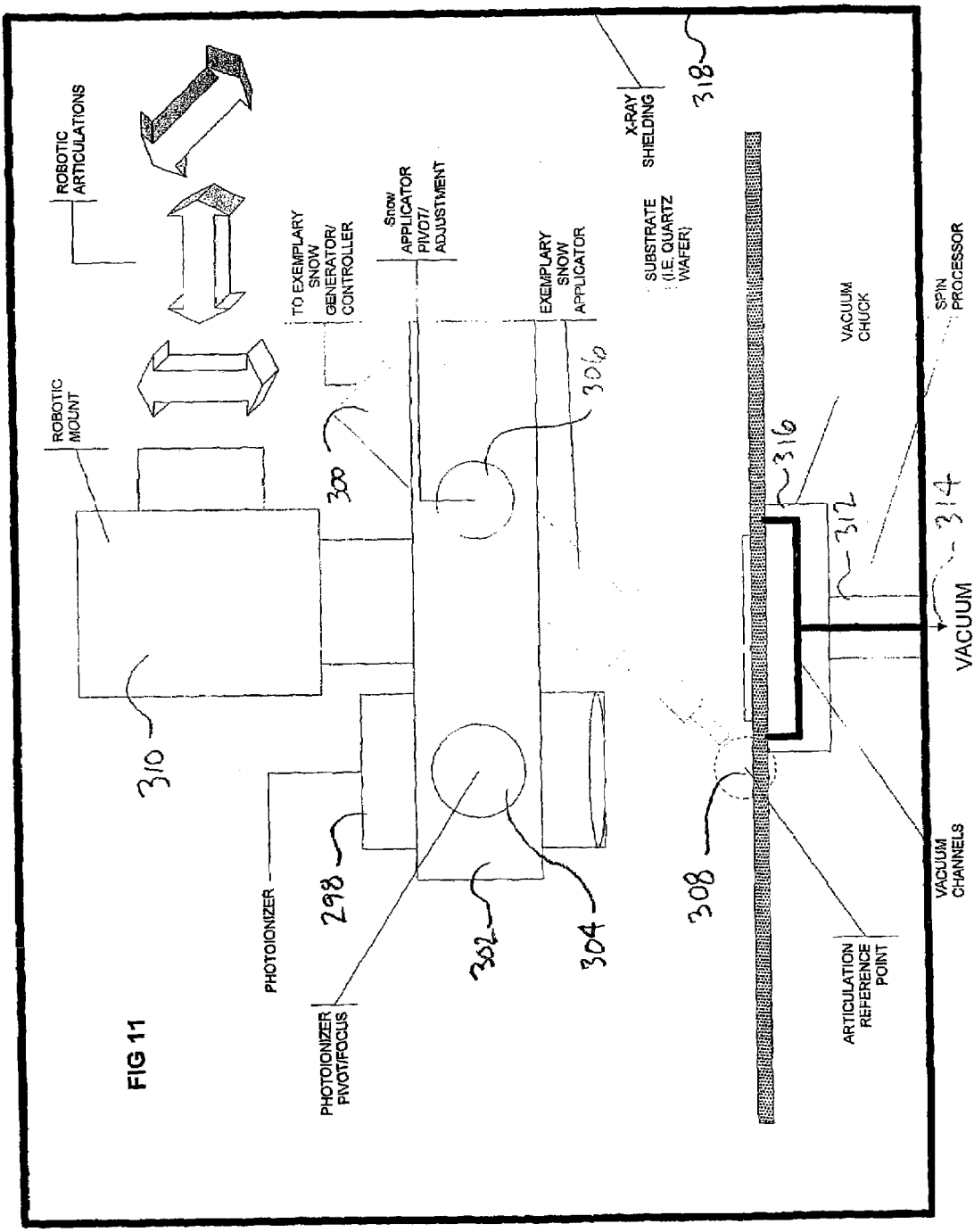

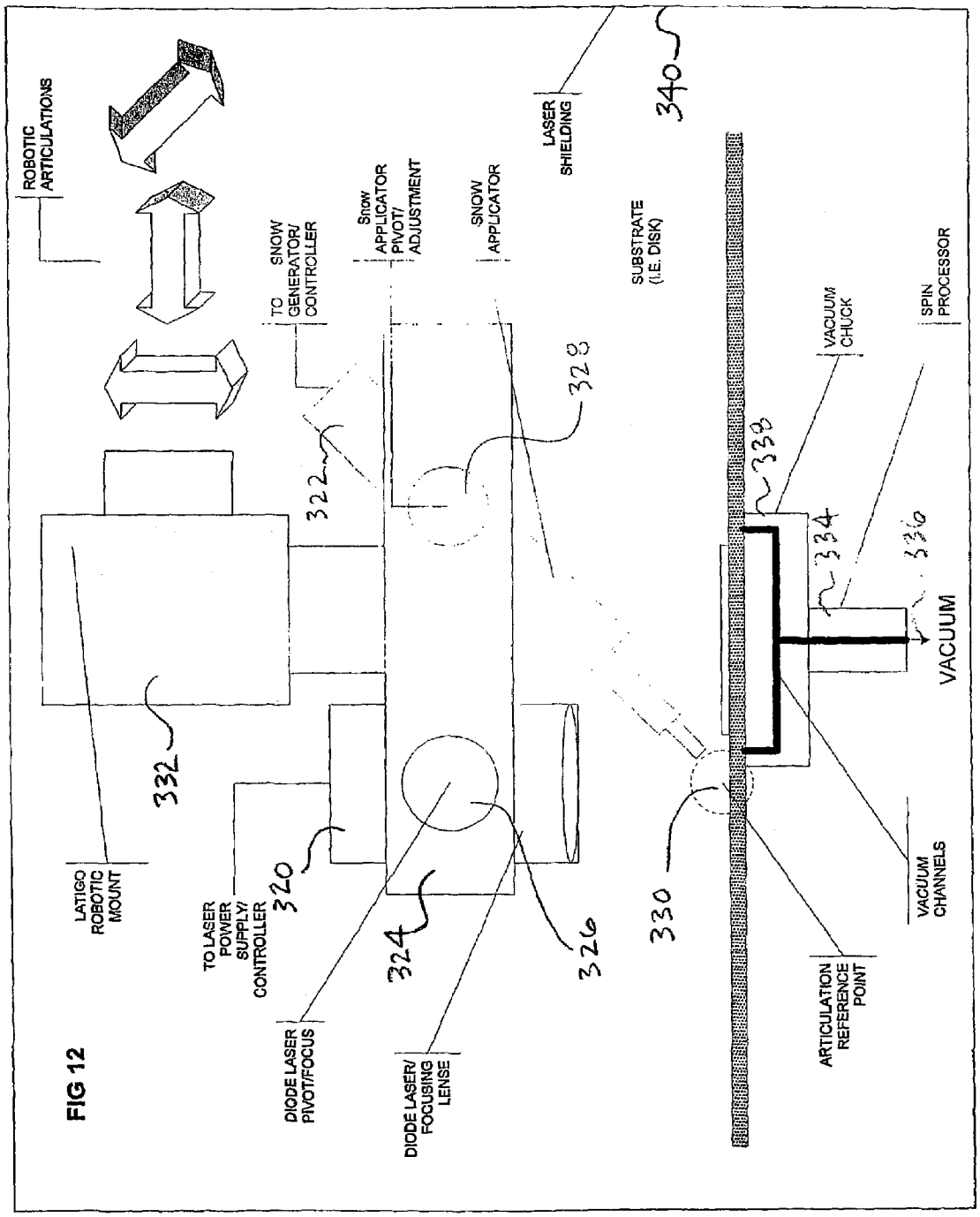

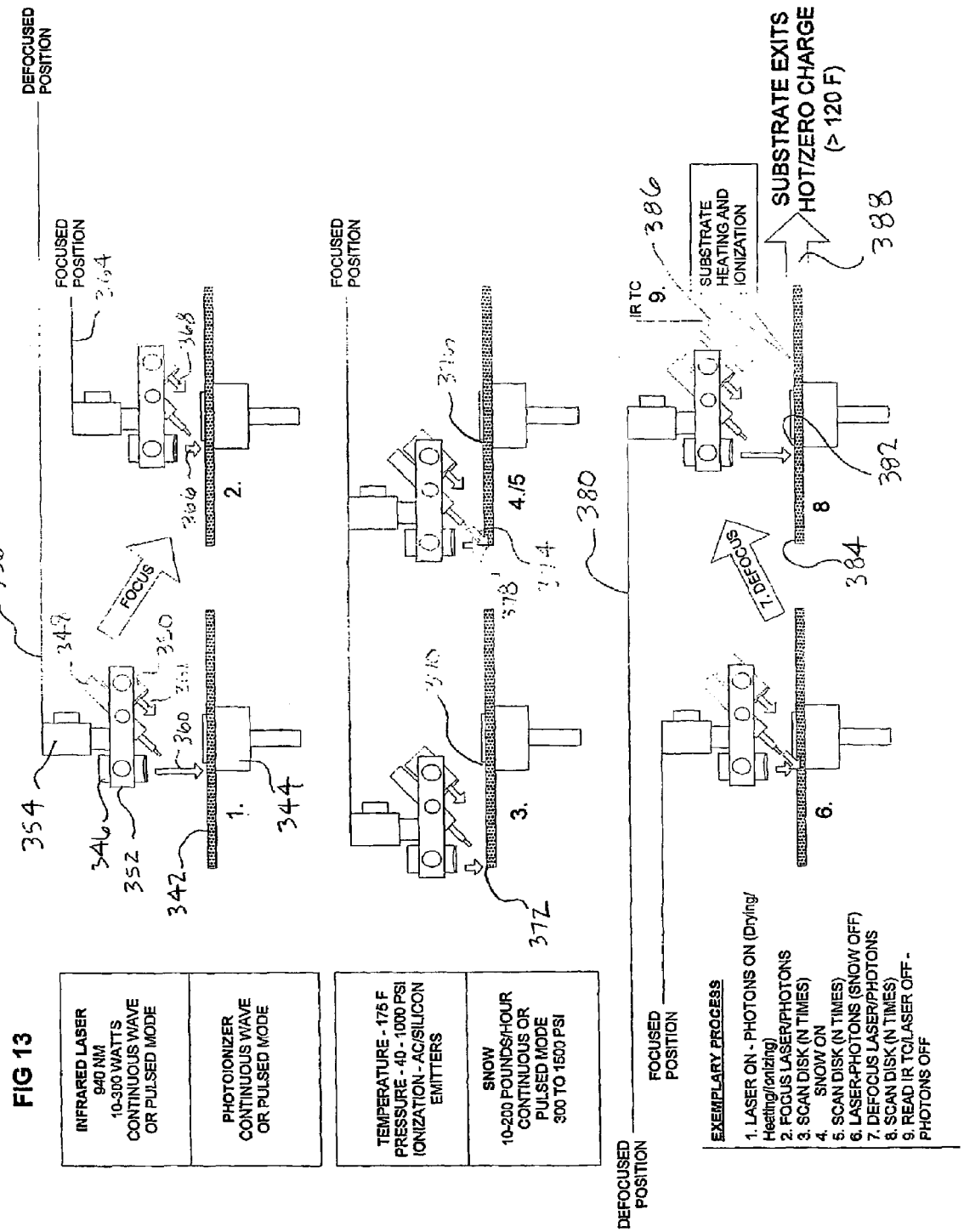

DENSE FLUID SPRAY CLEANING PROCESS AND APPARATUS

BACKGROUND OF INVENTION

Carbon dioxide exists as a low-density gas at standard temperature and pressure conditions and possesses phase boundaries with a triple point (Solid-Liquid-Gas co-exist in equilibrium like a glass of ice cubes and water) and a critical point (Liquid-Gas have identical molar volumes). Through pressure or temperature modification, carbon dioxide can be compressed into a dense gas state. The term 'Dense Phase Carbon Dioxide' is used herein to describe all phases of carbon dioxide: liquid state, supercritical state, dense gas state, and solid-state. These states have densities that are within the range of liquid-like or near-liquid substances.

Compressing carbon dioxide at a temperature below its critical temperature (C.T.) liquefies the gas at approximately 70 atm. Cooling liquid-state or gas-state carbon dioxide to its freezing point causes a phase transition into solid-state carbon dioxide. Compressing carbon dioxide at or above its critical temperature and critical pressure (C.P.) also increases its density to a liquid-like state, however there is a significant difference between compression below and above the critical point.

Compressing carbon dioxide above its critical point does not effect a phase change. In fact, carbon dioxide at a temperature at or above 305 K (88 F) cannot be liquefied at any pressure, yet the density for the gas may be liquid-like. At the critical point the density is approximately 0.47 g/ml. At or above this point carbon dioxide is termed a supercritical fluid (SCF). Supercritical carbon dioxide can be compressed to a range of liquid-like densities, yet it will retain the diffusivity of a gas. Continued compression of supercritical carbon dioxide causes continued increase in density, approaching that of its liquid phase.

Solid-state carbon dioxide is useful for removing particulates and trace organic residues from surfaces, using a process typically called Snow Cleaning or Snow Departiculation. Similar to liquid and supercritical fluid cleaning agents, solid-state carbon dioxide's cleaning power can also be described in both physical and chemical terms. The process of snow departiculation can be described as a kinetic energy transfer process called "Linear Momentum Transfer" in accordance with the following vector quantity:

P=MV, where

P—Linear Momentum of Solid Carbon Dioxide Particle or Surface Particle

M—Mass of Solid Carbon Dioxide Particle or Surface Particle

V—Velocity of Solid Carbon Dioxide Particle or Surface Particle

A stream of solid carbon dioxide particles having significant mass and velocity impact a stationary surface particle causing the surface particle with a given mass to accelerate away from the surface to a given velocity in accordance with the following equation:

$$V_{sp}=(M_{cp}/M_{sp})V_{cp}, \text{ where}$$

$V_{sp}$—Velocity of Surface Particle
$M_{cp}$—Mass of Carbon Dioxide Particle
$M_{sp}$—Mass of Surface Particle
$V_{cp}$—Velocity of Carbon Dioxide Particle The physical energy transferred during a snow departiculation process is usually sufficient to overcome strong electrostatic and intermolecular adhesive forces, commonly referred to as Van der Waal's forces, that hold small particles to the surface.

The mechanism for the removal of trace organic films using snow is not fully understood, but has been postulated to be a combination of momentum transfer and a phase change of minute solid carbon dioxide particles from solid-state to liquid-state (compression) and subsequent solutioning of trace surface residues. According to the phase diagram for carbon dioxide, a minimum impact compression of approximately 6 atm (88 psi) at 195 K is required to produce a liquid interphase. Energy transformations are possible other than the formation of a liquid phase, including particle fragmentation or shearing, gas phase transition (sublimation), and temperature rise in the solid (thermal energy) at impact.

Solid carbon dioxide is being used in a number of commercial product cleaning applications to remove trace organic and inorganic residues and particulates. Liquid carbon dioxide is rapidly expanded (joule-thompson expansion) through an orifice of a valve to form a mixture of subcooled gas state and solid state carbon dioxide—referred to as "snow" or "dry ice".

Solid carbon dioxide is applied in conventional applicators according to two types of applicators, described as Type I and Type II snow cleaning applicators as follows:

Type I Snow Applicator: Liquid carbon dioxide, stored in a high pressure bottle, is expanded from 850 psi at 298 K through a suitable nozzle into gas state (the propellant) and solid state carbon dioxide (the cleaning agent) and directed at a substrate. Conventional Type I applicators are commonly used in precision cleaning applications at close proximity to a substrate and have relatively simple operation and low-cost designs.

Type II Snow Applicator: Liquid carbon dioxide is first expanded into solid carbon dioxide using a suitable "dry ice machine", packed into dry pellets of uniform size, or shaved into a powder, and then fed into a spray apparatus using compressed air to propel the solid carbon dioxide from a spray nozzle. The air and solid mixture impacts the surface. A Type II applicator is typically used for cleaning large rigid structures because of its more aggressive action at close proximity (i.e., for coating removal) and long-range particle cleaning action (large and hard snow pellets). However, Type II equipment and operational costs are significantly higher than Type I systems.

Type I and Type II applicators include:
1. Fixed position applicators
2. Pistol grip applicators Conventional applicators are designed to have a single spray pattern, with various interchangeable nozzle designs for different substrates and surface cleaning applications. Type II designs can also vary impact energy through control of compressed air pressure whereas Type I designs cannot. Disadvantages associated with these mechanical designs include:
1. Fixed spray pattern.
2. Non-interchangeability of applicator designs (fixed<->handheld<->robotic).
3. Bulky configurations.
4. Uncontrolled tribocharging (electrostatic buildup) of non-metallic substrates such as plastics.
5. Rapid localized substrate cooling and subsequent deposition of contaminating residues.
6. Ineffective deep hole cleaning.
7. Expensive equipment costs.

Conventional snow cleaning applicators (Type I and II) suffer from the following disadvantages:

1. Impact energy and the amount of snow particles available at the surface decreases as the distance from the expansion valve to the applicator nozzle increases. Type I applicators must have an expansion valve located close to the nozzle and the nozzle must also be very close to the substrate to effectively remove residues.
2. Entrainment of ambient air which often contains moisture, particles, and other contaminating residues which condense onto surfaces which have been supercooled by the snow particle/gas stream.
3. Externally applied environmental control measures such as heated air and particle control hinder the cleaning performance and are applied so generally that localized condensation, particle entrapment, or tribocharging still occur. Conventional applications employ macro-environmental control (clean rooms, infrared heaters etc.) measures. Type I snow applicators cannot be used in relatively uncontrolled environments.
4. The process of expanding liquid carbon dioxide into solid state and subsequent contact of solid state carbon dioxide with surfaces causes a phenomenon called tribocharging, whereas the solid carbon dioxide (primary dielectric) builds electrostatic charge of up to 5 to 15 mJ at 10 KV to 20 KV as it contacts a substrate (secondary dielectric). This type of electrical charge build-up can be extremely damaging to microelectromechanical devices (or can induce latent ESD defects) and will cause a departiculated surface to become an attractor (magnets) of airborne particles following snow cleaning operations. Electrostatic effects can be caused through direct contact of charged solid carbon dioxide particles with the substrate which causes a discharge event or current flow through the surface (direct discharge) or may be caused through electrostatic field exposure and subsequent charging of the surface (induced charging).
5. In many applications, spray cleaning is performed independent of and prior to operations such as microwelding, adhesive bonding and thermal curing and soldering. Moreover, following production operations such as CMP the substrate is wet with aqueous residues and must be dried prior to snow cleaning operations. A method and apparatus is needed to serve as an integrated simultaneous drying, cleaning and production tool.
6. Xenon flashlamp technology is used with solid carbon dioxide (Type II) to remove old paint from aircraft surfaces. This type of technology uses an intense UV radiation (not a laser) burst to pyrolize substrates which produces a large amount of heating radiation as a by-product. The pyrolized paint is swept away from the substrate using a flow of carbon dioxide pellets. This technology is large and bulky and cannot be used to precisely clean small parts commonly found in the semiconductor, electrooptical and electronics markets. A precision coherent photon-based technique is needed to remove small contaminants from intricate assemblies.
7. In some applications, solid phase carbon dioxide chemistry requires physicochemical modification to provide enhanced separation and surface finishing capabilities. To date, no effective technique has been demonstrated to accomplish this requirement.
8. Type II applicators also suffer from being too aggressive (i.e., substrate damage), very noisy, bulky and too costly for most precision substrate cleaning applications.
9. Conventional snow cleaning applicators do not lend themselves to integration with production processes such as stamping, welding, bonding, curing and abrasive surface finishing operations because of the aforementioned problems discussed above.

Conventional snow cleaning processes do not have a method for real-time analysis of cleaned surfaces to accept or reject a particular cleaning operation. This is especially advantageous for in-line continuous quality control monitoring of surface cleaning performance.

Conventional ESD Control Methods used with Solid Carbon Dioxide:

Air Ionization—air is ionized using a DC or AC ionizer that is then flushed over an affected surface. The problem with this approach is that flowing air induces contamination through introduction of humidified air and potential particles. Also ionizing air impingement requires flooding the surfaces to be cleaned. This process can subtract from the cleaning energy. Moreover, the charges present within the structure of the cleaning agent are not reduced effectively using this technique.

U.S. Pat. No. 5,409,418 proposes a nozzle-mounted secondary gas ionizer which surrounds the snow stream with oppositely charged ions during impingement. U.S. Pat. No. 5,725,154 proposes neutralizing charges during snow cleaning following each cleaning pulse with a separate propellant gas neutralization pulse.

Most prior art suffers from these typical drawbacks:
Impossible to precisely control charges being delivered to a substrate—each substrate and atmosphere is different.
The portion of a substrate being impacted by the sublimable cleaning agent is not affected by neutralizing ions—only the circumference of the snow spray is affected.
Backside or nearby electrostatic charging due to electric fields is not affected by these techniques—electric fields pervade the materials creating complexly charged surfaces.

Nuclear Ionization—the substrate is exposed to radioactive particles (alpha). This process is line-of-sight and very short range. Obstructions of the smallest variety will eliminate beneficial ionization using this technique.

Fong '786, referenced herein, uses nuclear ionization to reduce accumulated electrostatic charges contained on solid carbon dioxide stored and mixed within a storage hopper and prior to and during delivery into a high pressure feed line. Fong '786 suffers from all of the drawbacks cited above.

Grounding—the substrate in grounded to earth using a suitable resistor to bleed charges at an acceptable rate. The main problem with this approach is that the electrostatic charge and electrical overstress are not effectively controlled on non-conductive substrates.

Antistatic Chemicals—this approach is the most effective on preventing charge creation by the cleaning agent. However this method tends to, by itself, become a source of chemical contamination within the cleaning process. To date no use of antistats within cryogenic cleaning agents is known Moreover, in cleaning quartz lenses, as well as many other non-conductive substrates it is difficult to control electrostatic charging of the quartz substrate during sublimable spray cleaning. Flooding the surfaces with ionized air only works prior to and following snow cleaning. During snow cleaning, as much as 2000 volts of electricity of positive and negative charge can be created following the snow-surface tribocharging contact event. Contaminants such as particles tend to move in relationship to thermal and electric field gradients—both of which are present in snow cleaning.

The backside of the quartz is typically opposite in charge (conservation of charge) during snow cleaning, therefore the particles once lifted from a front surface migrate around the substrate within a thin-film of subcooled atmosphere and become attracted to the oppositely charged surface on the backside. Quartz cannot be grounded and commonly used antistatic chemical agents contained in the cryogenic cleaning agent would leave stains during cleaning.

A photoelectric effect has been advantageously employed in different arts for decades. In certain commercial ionization applications, the photoelectric effect is used to produce highly energetic photons from 0.13 to 0.41 nm (9.5 to 3 KeV) to ionize an atmosphere surrounding a substrate during a production process.

As such there is a present need to provide an alternative dense fluid spray cleaning and separation apparatus and process which overcomes the limitations of conventional dense fluid spray technology and provides an environmentally-safe cleaning and finishing alternatives to organic solvents.

As such there is a present need to provide clean and effective electrostatic control method during sublimable cleaning processes. Since electrostatic charging is most prevalent in cryogenic cleaning such as carbon dioxide, argon or liquid nitrogen blasting—a three-dimensional ionization method and device is needed to resolve electrostatic charging effects in complex substrates being cleaned, regardless of composition, shape and size.

SUMMARY OF THE INVENTION

There have been many patents issued, and in this decade particularly, for solid-phase cleaning devices and processes. None employ a coaxial momentum transfer mechanism using thermal-propulsion control of particle velocity and size described herein. Improved coaxial dense fluid spray cleaning processes and apparatuses have been developed and are described herein which greatly improve cleaning performance, operational characteristics, adaptability and versatility over U.S. Pat. No. 5,725,154 by the present. Most importantly, the present invention significantly improves the performance of conversion of liquid phase C02 to solid phase and control of particle size and velocity.

The present invention provides the following new improvements (embodiments):

The present invention changes temperature and pressure of an inert optionally, ionizable propellant gas over a wide range of temperatures from 70 F to 300 F and pressures from 30 psi to 10,000 psi—this changes the physicochemical and kinetic characteristics of an enhanced snow particle mass generated within a condensor tube located at the center of a coaxial delivery system. Particle size, density, apparent hardness and velocity of a stream of condensed carbon dioxide can be precisely controlled by altering the temperature and pressure of the propellant in combination with altering the length of enhanced condensation tube which supercools and condenses precisely injected amounts of liquid carbon dioxide. An enhanced solid particle-gas mixture is produced prior to combining with condensation tube and propellant gas tube assemblies within a coaxial delivery line. A device called an Enhanced Joule-Thompson Condensation Reactor (EJTCR), containing a coiled or looped reaction tube having various lengths and diameters, is used to produce and densify a mixture of solid carbon dioxide particles (Enhanced Snow) from a source of purified liquid carbon dioxide. The EJTCR loop is thermally insulated and grounded and is comprised of various lengths and inside diameters of polyetheretherketone (PEEK) tubing. Because most of the condensation and sublimation heat transfer occurs within the EJTCR loop, the result is improved efficiency of the initial condensation reaction process. A propellant stream comprising pressurized, heated, inert and optionally ionized gas is produced in a separate subsystem. Purified inert gases such as carbon dioxide (preferred), nitrogen and clean dry air are heated using an in-line heater, filtered and ionized using an in-line DC ionizer assembly.

The two streams are first indirectly mixed (ion transfer and heat transfer) using various lengths, diameters and compositions of coaxial condensation assemblies and then directly mixed (heat transfer and momentum transfer) using various thrusting and mixing nozzle designs.

The efficiency, in relation to snow mass generated and cleaning energy performed, of the present invention is increased substantially over conventional Type I snow cleaning designs. Moreover, the present invention produces excess heat remaining following transfer, mixing and spraying operations, in accordance with the Carnot equation, which provides simultaneous local environmental control through inerting and thermostatting phenomenon.

The present invention describes several new and improved coaxial configurations, including interchangeable condenser tube assemblies, co-solvent injection system, various nozzles, manipulator and pistol grip.

The present invention further teaches a method of adding liquid and gas phase additives an enhanced condensation tube which are mixed and dispersed within the dense solid phase prior to injection and mixing within a nozzle. This provides improved physicochemical characteristics of the resulting spray cleaning agent such as improved contaminant solvency and lower tribocharging upon contact with a substrate.

The present invention provides a process and apparatus which destroys electrostatic charges generated through tribocharging via direct contact of solid carbon dioxide particles to the substrate as well as cool and heated gas movement over adjacent surfaces. Unlike prior art approaches to this problem using gas delivered or radioactive sources of charged counterions, the present invention applies soft x-ray radiation (photons) to the stream of snow particles and substrate simultaneously. The present invention is superior over prior art in that electrostatic charges are destroyed in transit, during contact at the solid-solid interface and during sublimation at the surface.

The present invention teaches an improved cleaning and production tool combining a semiconductor laser operating at the near-infrared region. Using such as laser simultaneously with the present invention provides the following unique process capabilities:

1. Thermal drying of substrates before, during and following snow cleaning.
2. Superior spot heating during snow cleaning to assist with contaminant separation (lower stiction).
3. Post snow cleaning production adjunct operations such as a laser welding, thermal curing, and soldering.

This embodiment uses a low-cost diode laser operating in the near infrared at a wavelength of between 780 and 940 nm.

Another feature of the present invention is the combination of a relatively new analytical technique called Optically Stimulated Electron Emission (OSEE) spectroscopy, also called photoelectron emission (PEE), with the present snow cleaning processes and apparatus. OSEE provides for instantaneous feedback to a host computer controlling and applying the cleaning process. Real-time correlation between cleaning parameters temperature, pressure, condensation tube length and contact time) and OSEE cleanliness can be established in-situ and used to verify surface cleanliness following each cleaning operation.

Another aspect the present invention is the addition of solid abrasives to the propellant gas supply. Mixing solid abrasives with the dense snow mass provides an improved microabrasive finishing of substrates—cryogenic microabrasive finishing. The snow spray embrittles surface features such as burrs during simultaneous impingement of abrasive snow additives. The surface features of the substrate become harder at a lower temperature than the subsurface—therefore surface finishing is aided through an increase in hardness (less rolling and rounding of edges and burrs). Following this the spray is used to remove residue dusts and residues from the finished substrate.

Finally, the present invention discloses a cleaning system and system software for utilizing the various examples described above in a closed workcell using a centralized multi-axis programmable robot operating in a circular workcell pattern and using various stations having increasing particle cleanliness. This embodiment teaches the use of various robot hand tools—pick and place tool in combination with a cleaning tool, cleaning-laser tool, cleaning-inspection tool, or cleaning-ionization tool. Substrates are first picked up using a pick and place tool and moved from a dirty loading zone into a cleaner process zone. The robot then changes hand tools, placing the hand tool in a cleaning fixture for subsequent cleaning, and picks up any one of several novel snow or snow-process robots tools. Following robotic cleaning and/or processing, the robot cleans the pick and place tools critical surfaces, and replaces the cleaning tool with the newly cleaned pick and place tool. The cleaned substrate is picked up and placed in a still cleaner unload zone. The combination of a zoned workcell with a programmable robot, software and novel cleaning and cleaning-production tools provides an economical, versatile and adaptable cleaning and production tool.

BRIEF DESCRIPTION OF THE DRAWINGS

These and other objects and advantages of the present invention will be obvious to those of ordinary skill in the art after having read the following detailed description of the preferred embodiments which are illustrated in the various figures summarized below.

FIG. 1f is a diagram illustrating the difference between conversion of heat to work (velocity) produced by conventional devices and a device in accordance with the present invention.

FIG. 1h is a diagram illustrating the cumulative effect produced by the present invention with respect to local environmental control of sublimation heat management, ambient inerting and tribocharge control.

FIG. 6 is a cross-sectional and a front view of a conductive spray applicator for use in accordance with the present invention.

FIG. 7 is a cross-sectional and a front view of a fanned spray applicator for use in accordance with the present invention.

FIG. 9 is a partial cross-sectional view of a extension manipulator for use in accordance with a spray applicator.

FIG. 10 is a partial cross-sectional view of a handgun spray applicator for use in accordance with the present invention.

FIG. 11 is a schematic drawing illustrating a photoelectron generator integrated with an spray applicator for use in accordance with the present invention.

FIG. 12 is a schematic drawing illustrating a diode laser integrated with an exemplary spray applicator.

FIG. 13 is a schematic drawing illustrating both photoionization and diode laser heating.

DETAILED DESCRIPTION OF THE PREFERRED EMBODIMENTS

The invention describes an improved adjunct separation mechanism which involves the formation of variable-geometry microscopic substances called "Snow Gels" comprised of trace organic surface residues (treated as solvents or solutes) dispersed in solid phase carbon dioxide particles (treated as a subcooled solvent-solute matrix). This mechanism is supported by solubility research performed by Myers and Prausnitz (M. N. Myers and J. M. Prausnitz, "Thermodynamics of Solid Carbon Dioxide Solubility in Liquid Solvents", Ind. Eng. Chem. Fund., 4, 209,1965) in which they treat solid carbon dioxide (solid-state xenon has also been studied) as a subcooled liquid to determine cohesive energy values.

Solid carbon dioxide possesses electron acceptor (Lewis Acid) and molecular quadrapole moment properties which contribute to a hydrocarbon-like cohesion energy and complex forming ability with hydrocarbons. Solid carbon dioxide has a measured solubility parameter of between 23 $MPa^{1/2}$ and 20 $MPa^{1/2}$ in the temperature range of 140 K to 200 K that is comparable to its liquid-state cohesive energy. Therefore, the removal of thin films of hydrocarbons using solid-state carbon dioxide may occur through a liquid-subcooled liquid/particle mass transfer mechanism, whereas the Snow-Hydrocarbon interface is proposed to be the continuous formation and removal of a lyophilic crystalline gel or rigid colloid which I call a snow-gel. This mechanism is further supported by the fact that heavy metals are insoluble in liquid carbon dioxide, but should form complexes or colloids with organic-like solids like solid-phase carbon dioxide. Cleaning tests show a reduction in metal ion contamination using solid phase cleaning.

The proposed compression-liquefaction mechanism may be an intermediate step of snow-gel formation, whereby the liquid-hydrocarbon is transformed instantaneously into a snow-gel particle through rapid evaporation and cooling. Research by Myers and Prausnitz confirms the solubility of solid carbon dioxide with several hydrocarbon systems. Laboratory experiments confirm the formation of a stable gel-like substances with various mixtures of hydrocarbon liquids and solid carbon d a schematic diagram illustrating a dense fluid spray cleaning apparatus including an enhanced joule-thompson condensation reactor ("EJTCR") loop in accordance with the invention ioxide.

Figure 1A:
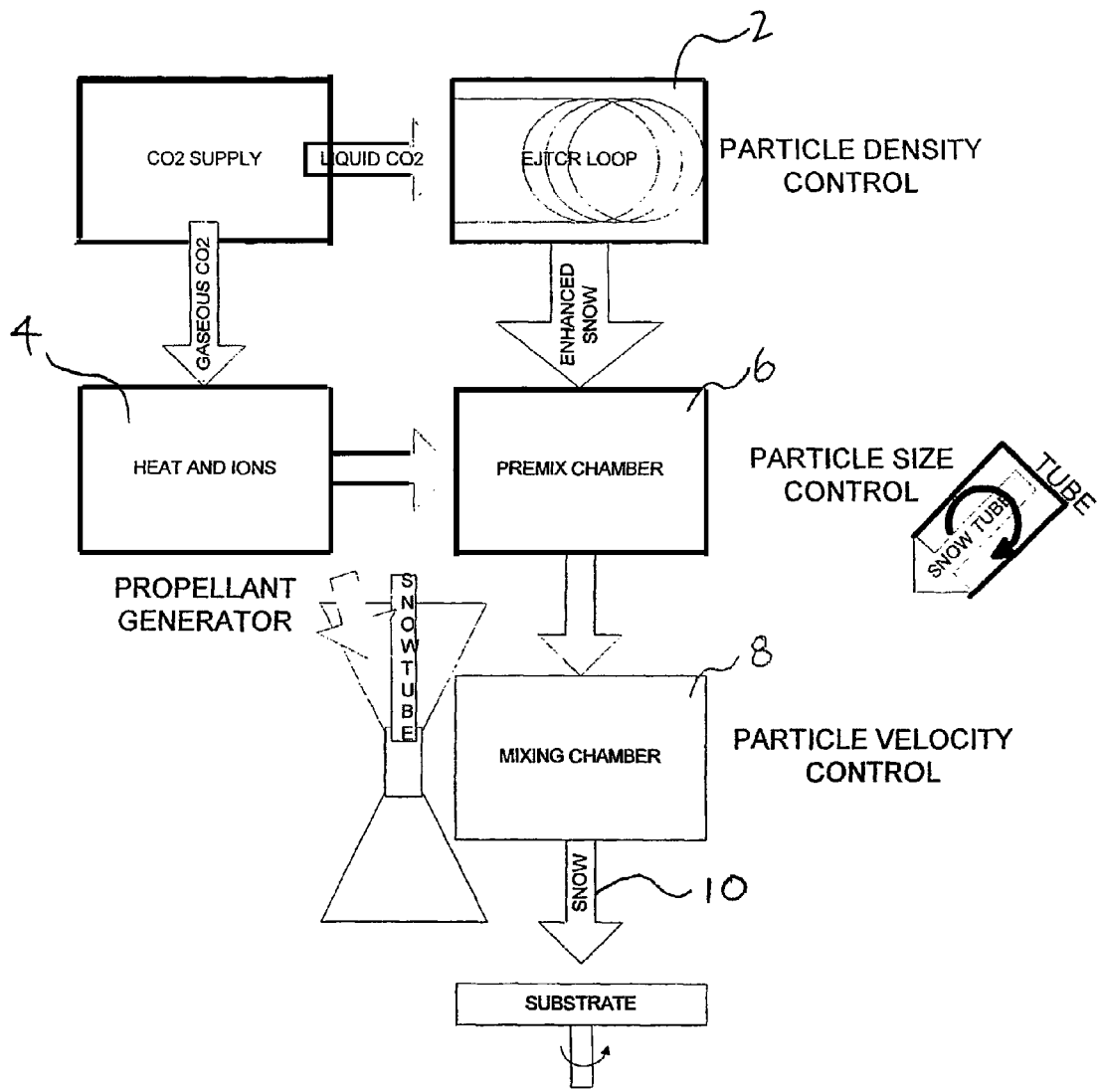
FIG. 1a is a block diagram illustrating a dense fluid spray cleaning apparatus including an EJTCR loop in accordance with the invention.
Figure 1B:
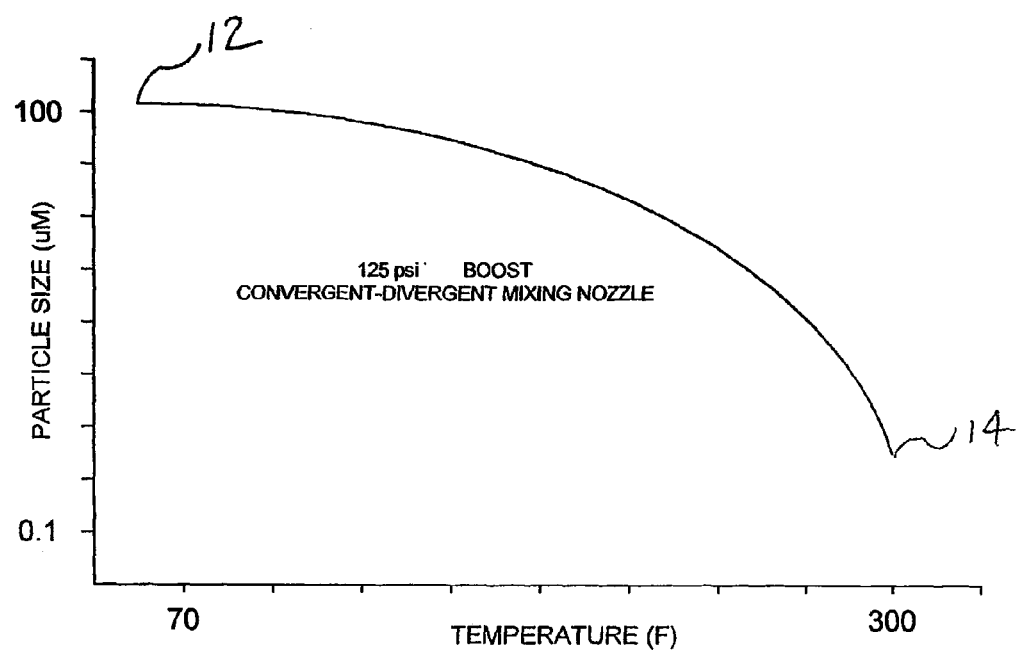
FIG. 1b is a graph illustrating the relationship between particle size of solid carbon dioxide and propellant gas temperature with a constant supersonic thrusting pressure.
Figure 1C:
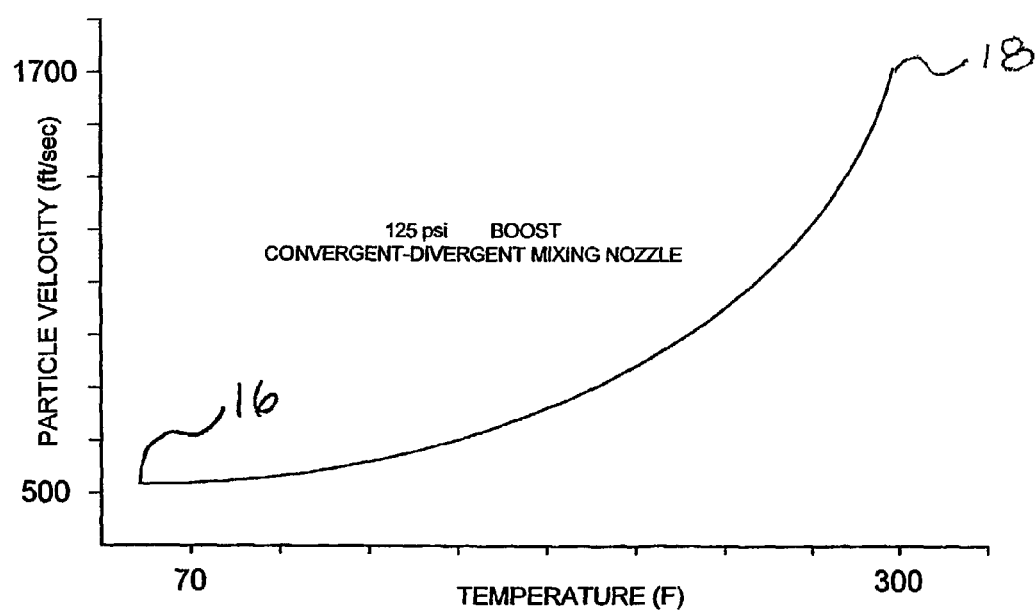
FIG. 1c is a graph illustrating the relationship between velocity of solid carbon dioxide particles and propellant gas temperature with a constant supersonic thrusting pressure
Figure 1D:
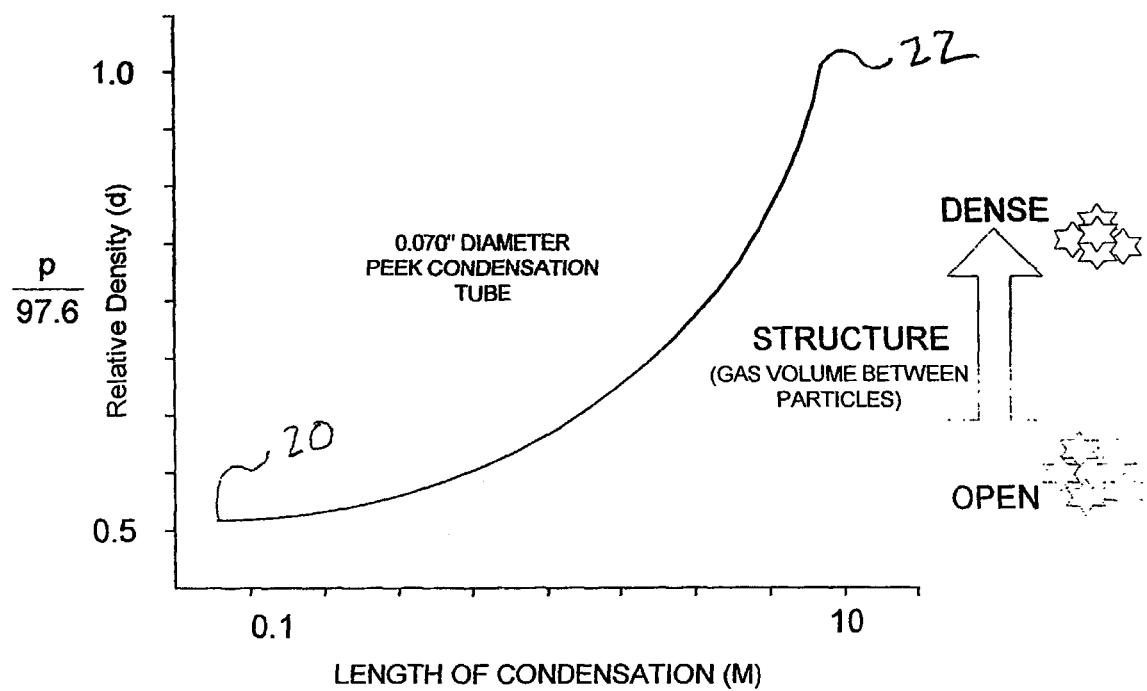
FIG. 1d is a graph illustrating the relationship between solid carbon dioxide particle relative hardness and length of condensation tube with a constant diameter.
Figure 1E:
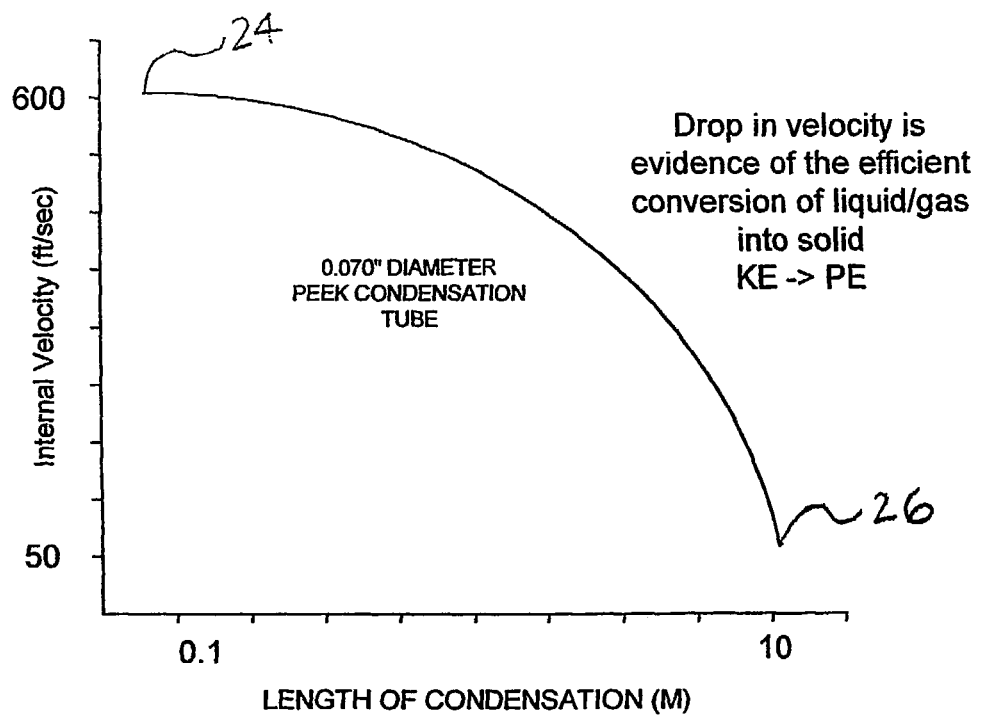
FIG. 1e is a graph illustrating the relationship between velocity of condensed solid carbon dioxide-subcooled gas mixture and length of condensation tube with a constant diameter.
Figure 1G:
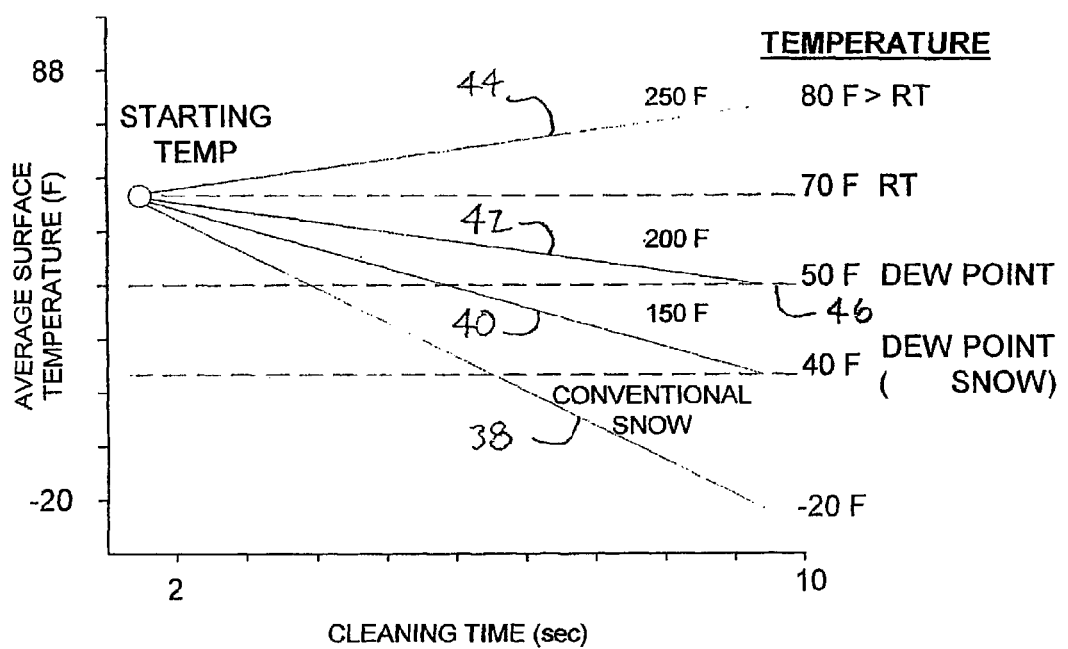
FIG. 1g is a graph comparing the difference between substrate thermostatting and local ambient inerting phenomenon in conventional devices and a device in accordance with the present invention.

Referring to FIG. 1*a*., there is shown a block diagram illustrating a dense fluid spray cleaning apparatus in accordance with the invention. The apparatus includes an (EJTCR) (2), a $CO_2$ supply (3), a spray nozzle, a thermal inert or thermal ionized gas (propellant) generator (4), a premix chamber (6), and a mixing chamber (8).

Small amounts of liquid carbon dioxide, preferably from about 5 to about 200 lbs/hr, more preferably from about 10 to about 30 lbs/hr, is metered from the $CO_2$ supply (3) under a pressure of between 300 and 1000 psi and at a temperature of between 0 F and 85 F and injected through a spray nozzle into the EJTCR loop. The liquid carbon dioxide expands rapidly into a mixture of approximately 50% solid and 50% subcooled gas immediately upon injection. Following this expansion, the resulting 50:50 solid:gas mixture is introduced into a thrust forming cavity having various geometries to produce a supersonic spray stream.

The EJTCR (2) comprises a coiled section of polyetheretherketone (PEEK) tubing (loop) which is overwrapped with a grounded conductive shielding (Faraday Cage) such as a metal spring or metal foil and further overwrapped with a thermally insulative material such as polyolefin. PEEK is a preferred loop material because it is highly flexible, can withstand very high pressure and very low temperatures, and is a good thermal insulator.

In the present invention, the initial expansion is a "seeding" process. As the seed or slug of subcooled liquid and gas mixture travels down the length of the EJTCR loop, the gas is condensed or coagulated into solid and solid is compacted into a dense mass. The EJTCR loop has an O.D. of from about 1/32" to about 1/8", preferably about 1/16" and an ID of from about 0.0025" to about 0.080", preferably from about 0.02 to about 0.08". The EJTCR loop diameter creates expansion of the gas which causes a temperature decrease. The EJTCR loop has a length of from about 6" to about 20 ft, preferably from about 4 ft to about 5 ft. The EJTCR loop length creates compression through drag forces. The temperature decrease (decreasing with increased loop length) is observed as a result of heat transfer from expanding gas molecules—this results in a condensation of expanding gas into solid phase (kinetic energy is converted into potential energy). As the mixture travels the length of the thermally insulated EJTCR loop, very efficient heat transfer occurs. As such, the longer the EJTCR loop—the more efficient the coagulation process. Moreover, increasing the length of the EJTCR loop increases pressure and drag within the loop—causing the solid particles to pack together into a dense solid carbon dioxide mass.

Microdroplets of liquid carbon dioxide are caused to shear under turbulent conditions (Reynolds Number>10,000) within the EJTCR loop. Gas-particle velocity decreases and turbulent shear increases over the distance of the loop. The longer the loop—the higher the turbulent shear. This increase in shear increases coagulation of liquid and gas phases into solid phase by contacting vapor within the loop with newly formed solid particles having a temperature that is below the saturation temperature. Heat transfer within the loop is a combination of two modes—conduction and convection. The enhanced condensation process involves mass transfer simultaneous with heat transfer. The EJTCR loop maintains high pressure and low temperature over along distance (time). Increasing pressure, decreasing temperature and increasing time enhance the condensation process. The net result of the EJTCR process is an efficient and controllable conversion of liquid carbon dioxide into a relatively slow moving dense solid mass of carbon dioxide particles—called enhanced snow. Increasing the loop length for a given loop internal tube diameter increases conversion. The purpose of wrapping the loop with grounded electrical shielding is to drain away electrostatic charges generated during the coagulation process and movement of this dielectric mixture through the EJTCR loop. An additional overwrap of thermal insulation on the loop prohibits heat transfer from the ambient atmosphere which would be detrimental to particle growth.

A thermal inert or thermal inert ionized propellant gas generator (4) provides a source of propellant gas. Suitable propellant gases include carbon dioxide, nitrogen or clean dry air or other gases which can be purified, filtered, heated and optionally ionized. The preferred propellant gas is carbon dioxide. The propellant gas is used herein not only as a propellant, but simultaneously as a solid particle size modifier, ion neutralizer, inerting agent, and thermostat agent. In some embodiments the gas generator includes an in-line ionizer for ionizing the propellant gas to produce positive and negatively charged gas molecules. This mixture of charged gas molecules is used to bathe the snow tube and propellant gas tube assemblies within premix chamber—neutralizing charges created by the movement of dielectric gas and solids within each tube. An alternative design uses a grounded metal cage to drain away charges generated. A benefit of using the in-line ionizer is that the present invention can be used to spray thermal ionized gas on a substrate following cleaning to insure that no residual electrostatic charges are left behind following cleaning which might attract airborne particles.

The premix chamber (6) is a section where the propellant gas is indirectly contacted with the enhanced snow from the EJTCR. The propellant gas is caused to flow over a predetermined length of flexible (PEEK) or rigid (stainless steel) inner tube, the snow tube, carrying the enhanced snow. The propellant gas is carried in an outer coaxial tube, the propellant gas tube, which itself is either flexible (Teflon) or rigid (stainless steel. The coaxial premix chamber transfers heat, and optionally ions, under controlled conditions from the propellant gas to the enhanced snow. Changing the type of premix snow tube from PEEK to stainless increases heat conduction. Heat contained in the propellant gas slowly diffuses through the snow tube and is transferred to the enhanced snow. This causes the enhanced snow to sublimate. Increasing the heat content of the propellant gas and increasing the contact time (length of premix chamber) increases the sublimation. As such, the enhanced snow is expanded and accelerated towards the end of the snow tube. It has been discovered that heating the snow tube greatly improves snow particle flow from the EJTCR and up to the mixing chamber. Without wishing to be bound by a theory of operation, it is believed that a thin laminar high velocity carbon dioxide gas sheath is produced between the snow particles and the inner wall of the PEEK or stainless tube wall. This is analogous to lubrication and prevents the dense snow particles from packing, clogging and spitting from the snow tube. There is a significant difference in snow tube flow characteristics with and without the presence of propellant gas flow. Moreover, heat transfer through the snow tube initiates the process of solid particle size reduction and provides an initial impulse to the mixture prior to injection into the mixing chamber.

The propellant gas and enhanced snow are combined in the mixing chamber (8) to produce a composite supersonic spray stream. The mixing chamber includes a nozzle wherein the inner snow tube is fed into a mixing section of a convergent-divergent mixing nozzle. The propellant gas is compressed through the convergent section that increases pressure and reduces velocity, mixed with the enhanced snow particles and expanded through a divergent section wherein the pressure of the mixture is reduced which causes the mixture to rapidly accelerate out of the mixing chamber. The heat content of the propellant gas generates a significant impulse from sublimating the dense enhanced snow mass. Depending upon the nature of the mixing nozzle, different impulse and spraying patterns can be produced. Depending upon the temperature and pressure of the propellant gas, a variety of particle size ranges can be produced and the resultant mixture(10), has a much higher energy content than those produced using conventional snow spraying devices.

Having discussed in general the basic operation and characteristics of the present invention, following is a detailed discussion of each core component and adjunct systems and processes that control and optimize the present invention.

1*b* illustrates the relationship between particle size of solid carbon dioxide and propellant gas temperature with a constant supersonic thrusting pressure. By varying the temperature of a propellant gas and (1) first indirectly contacting propellant gas with the enhanced snow through a thin heat transfer wall (Premixing heat and ions) and then (2) directly mixing the propellant gas with the enhanced snow particle mass—the average solid carbon dioxide particle size of the resulting spray stream can be altered considerably. The particle size can be varied over a wide range from 100 micrometers (12) to 0.2 micrometers (14) by varying the temperature of the propellant gas from 70 F to 300 F. This variance is relatively constant for a fixed propellant pressure, fixed EJTCR loop length and inner diameter and premix distance.

FIG. 1*c* illustrates the relationship between velocity of solid carbon dioxide particles and propellant gas temperature with a constant supersonic thrusting pressure. By varying the temperature of a propellant gas and (1) first indirectly contacting propellant gas with the enhanced snow through a thin heat transfer wall (Premixing heat and ions) and then (2) directly mixing the propellant gas with the enhanced snow particle mass—the average solid carbon dioxide particle velocity of the resulting spray stream can be altered considerably. The particle velocity can be varied over a wide range from less than 500 ft/sec (16) to greater than 1600 ft./sec (18) by varying the temperature of the propellant gas from 70 F to 300 F. This variance is relatively constant for a fixed propellant pressure, fixed EJTCR loop length and inner diameter and premix distance.

FIG. 1*d* is a graph illustrating the relationship between solid carbon dioxide particle relative hardness and length of condensation tube with a constant diameter. By varying the length of the EJTCR loop—the relative density (d=p/97.6) of the solid carbon dioxide particles stream contained within the snow tube can be altered considerably. The relative density can be varied over a wide range from 0.5 g/cm3 (20) to approaching 1 g/cm3 (22) by varying the length of the EJTCR loop from 0.1 meters to 10 meters. This variance is relatively constant for a fixed diameter of thermally insulated PEEK condensation tube.

FIG. 1*e* is a graph illustrating the relationship between velocity of condensed solid carbon dioxide-subcooled gas mixture and length of condensation tube with a constant diameter. By varying the length of the EJTCR loop—the velocity of the enhanced solid carbon dioxide particles stream contained within the snow tube can be altered considerably. The velocity is varied over a wide range from 600 ft/sec (24) to approaching 50 ft/sec (26) by varying the length of the EJTCR loop from 0.1 meters to 10 meters. This variance is relatively constant for a fixed diameter of thermally insulated PEEK condensation tube.

FIG. 1*f* is a diagram illustrating the difference between conversion of heat to work (velocity) produced by conventional devices and a device in accordance with the present invention. By varying the temperatures of mixing of the propellant gas having variable pressure and high temperature with an enhanced snow particle stream having high density and low temperature, and where the propellant gas velocity is supersonic and the enhanced snow stream velocity is subsonic—the Carnot Efficiency (E—work performed), expressed as E=Tmax−Tmin/Tmax, can be altered over a range of efficiencies and results in a much improved E over conventional snow spray streams. The E can be varied over a wide range from 30% (28) to greater than 50% (30) by varying the temperature of the propellant gas from 70 F to 300 F. This variance is relatively constant for a fixed diameter of thermally insulated PEEK condensation tube, premix chamber and propellant gas pressure. By contrast, conventional snow streams have a calculated E of between 5% (32) and 30% (28). The work performed in the present invention is expressed as impulse, thrust or propulsion (34). The residual heat of the propellant gas, expressed as heat not converted into work (1-CE), is used in the present invention for in-situ ambient inerting and thermostatting at or near the substrate during impact of supersonic snow particles (36).

By contrast, conventional snow sprays produce a 50:50 mixture of very cold solid and gas. The gas in this conventional approach is also the solid propulsion agent—however its temperature is near the saturation temperature. As a result, this gas produces undesirable environmental effects such as ambient inclusion and condensation of moisture and rapid freezing of the substrate.

FIG. 1*g* is a graph comparing the difference between substrate thermostatting and local ambient inerting phenomenon in conventional devices and a device in accordance with the present invention. The resultant temperature of a composite spray used in the present invention is much higher and is variable as compared to conventional snow spray streams. To demonstrate the thermostatting characteristics of the present invention, a measurement of average surface temperature during normal scan spraying (1 inch/sec) a 4 inch by 4 inch (16 in2) aluminum plate using a conventional snow gun (Va-Trans-SnoGun) and the present invention shows the various thermal profiles produced over time. A conventional snow spray gun produces an average surface temperature of −20 F after 10 seconds of scan spray (38) and almost instantaneously moisture is condensed on the substrate. By contrast spraying using the present invention produces a different thermal profile for each successive increase in temperature– 150 F (40), 200 F (42) and 250 F (44). Although the sprayed surface temperature of the substrate dropped below the ambient dew point (46)—there was no visible condensation on the substrate. This is due to the local inerting characteristics and phenomenon associated with the present invention.

FIG. 1*h* is a diagram illustrating the cumulative effect produced by the present invention with respect to local environmental control of sublimation heat management, ambient inerting and tribocharge control. The propellant gas used in the present invention is used uniquely as a dynamic particle size control agent, ion transfer agent, propulsion agent, thermostatting and inerting agent. By controlling propellant gas temperature, flowrate and pressure, the local environment above and on the surface being cleaned is controlled. Environmental control characteristics include simultaneously supplying heat to sublimating solid particles upon impact (sublimation heat energy—thermostatting) and excluding the ambient atmosphere from the area being cleaned (inerting).

Figure 1I:
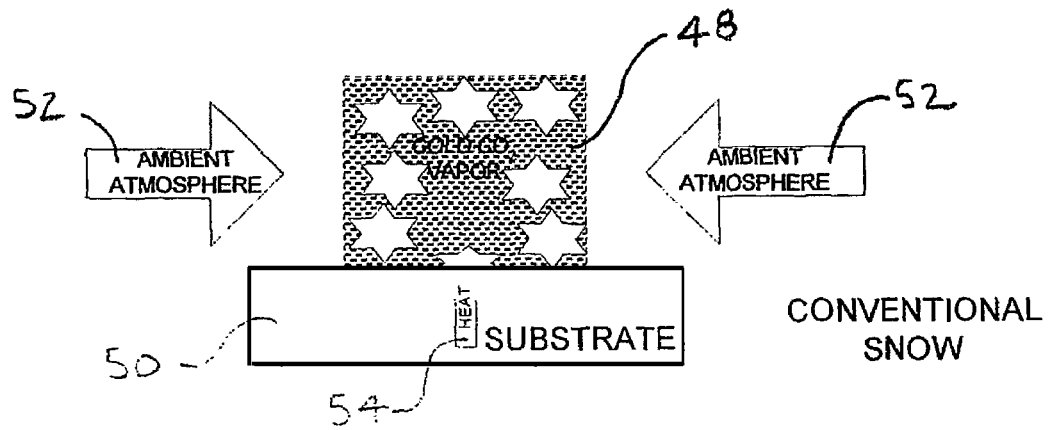
FIG. 1i is a diagram illustrating the effect upon local ambient atmosphere and substrate using conventional snow cleaning.
Figure 1J:
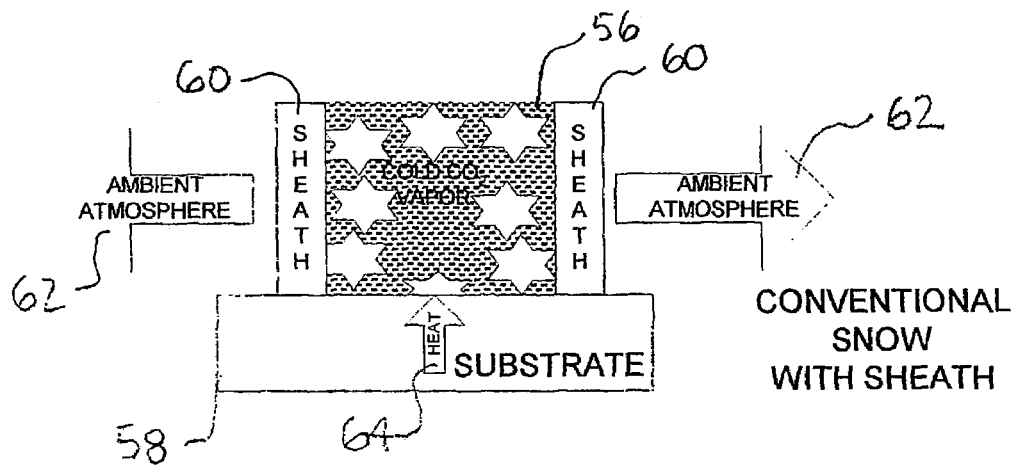
FIG. 1j is a graphical representation of the effect upon local ambient atmosphere and substrate using conventional snow cleaning with a sheath of inerting gas.
Figure 1K:
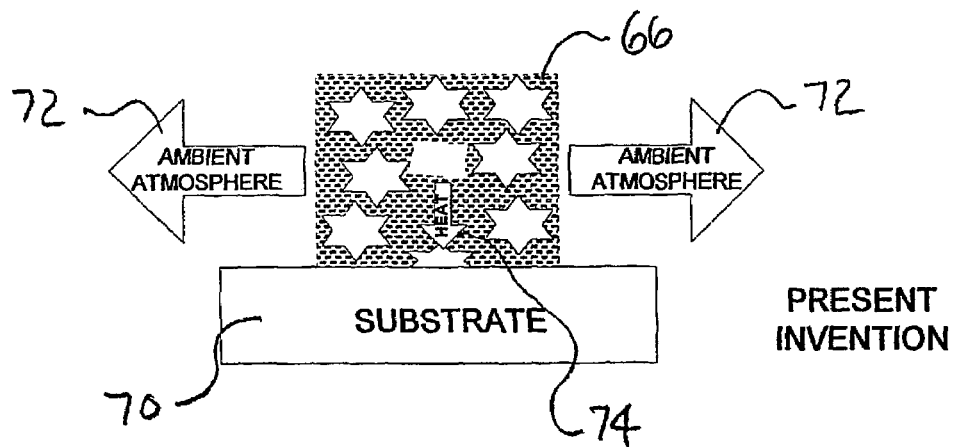
FIG. 1k is a graphical representation of the effect upon local ambient atmosphere and substrate using the present invention.

Referring to FIGS. 1*i*, 1*j* and 1*k*, the environmental control benefits provided by the present invention are illustrated by comparing conventional snow cleaning methods and devices to the present invention. FIG. 1*i* shows the environmental dynamics of a simple conventional snow spray device. An extremely cold stream of solid and gaseous carbon dioxide (48) is directed at a substrate (50). Two undesireable phenomenons occur simultaneously. First, the ambient atmosphere (52) which surrounds the spray stream (48) and which contains particle, moisture and hydrocarbon contamination is condensed into the cold spray stream (48). Once incorporated into the stream, the contaminants are immediately deposited onto the substrate (50). A second undesirable effect is heat transfer from the substrate. Because the conventional snow stream is very cold, upon impact the cleaning spray sublimates and extracts significant heat (54) from the surface. The surface must be heated continuously from below or above to compensate for this sublimation heat energy.

FIG. 1*j* shows the environmental dynamics of a simple conventional snow spray device with a shroud of heating gas (called sheath flow). An extremely cold stream of solid and gaseous carbon dioxide (56) is directed at a substrate (58) with a sheath flow of inert gas flowing concentrically about the snow stream (60). In this application, ambient atmosphere (62) is excluded from the center of the cleaning zone. The undesirable effect here is the same as a simple conventional snow spray operation—heat is transferred from the substrate. Because the center stream is a conventional snow stream and is very cold, upon impact the cleaning spray sublimates and extracts significant heat (64) from the surface. The surface must be heated continuously from below or above to compensate for this sublimation heat energy or the sheath flow must remain on for some period of time following the snow cleaning spray—operating in a pulse mode.

FIG. 1*k* shows the environmental dynamics of the present invention. An extremely cold stream of solid and gaseous carbon dioxide is mixed with superheated gas to produce the stream (66) which is directed at a substrate (70). In the present invention, ambient atmosphere (72) is excluded from the center of the cleaning zone and, unlike conventional approaches, heat (74) is transferred to the surface of the substrate. Because stream contains residual heat, it is expanding from the central cleaning zone and excludes the ambient environment. Additionally, when the entrained snow particles sublimate at the surface, heat (74) is extracted preferentially from the surrounding component around, above and at the surface of the substrate. The present invention packages sublimation heat and delivers it with the solid snow particle. The result is that the surface does not have to be heated continuously from below or above using external heat sources to compensate for this sublimation heat energy and separate inerting atmospheres do not have to be incorporated.

Figure 1L:
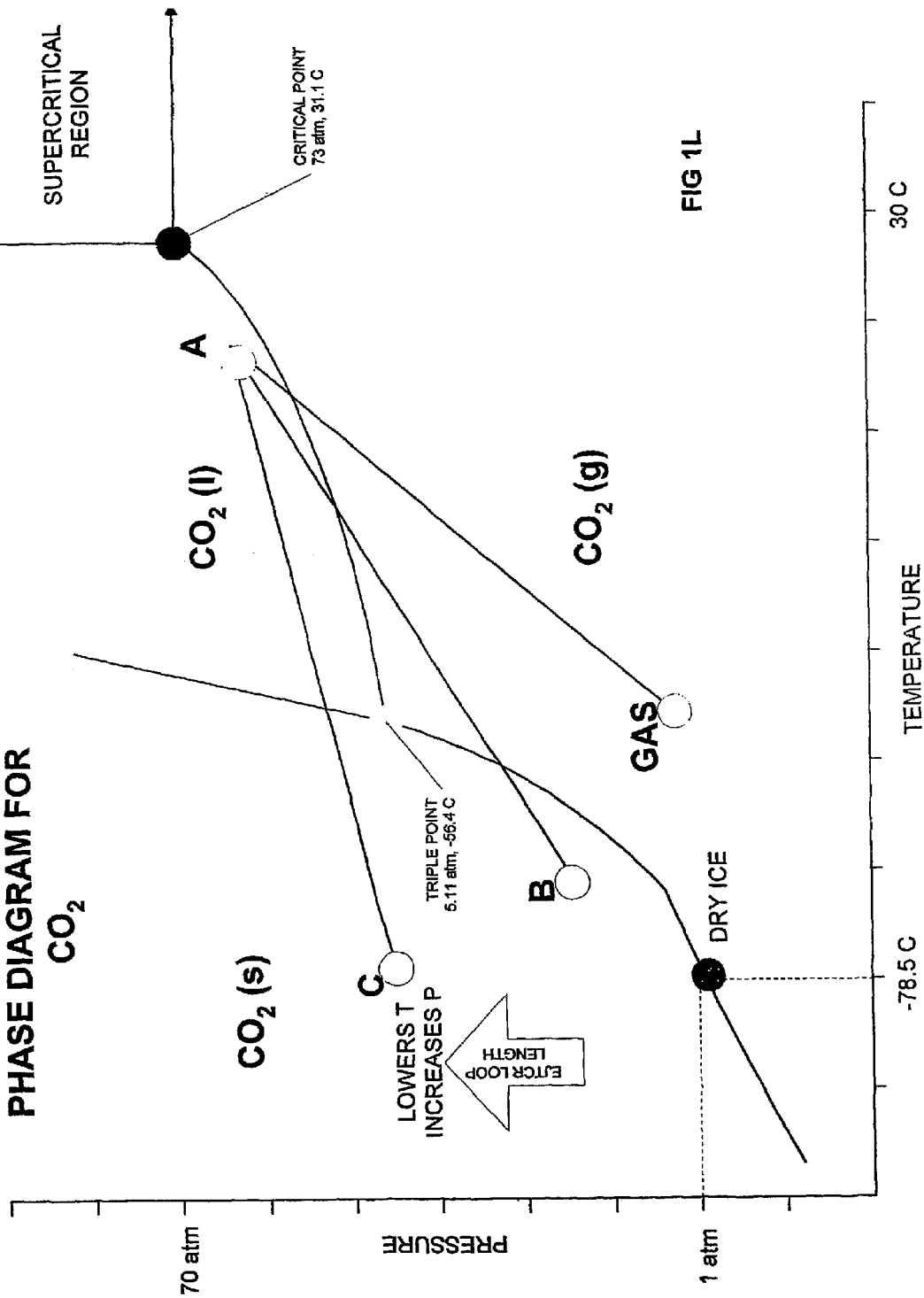
FIG. 1l is a phase diagram showing effect on relative snow density and generation efficiency with respect to EJTCR loop length and diameter.

FIG. 1*l* shows the overall relationship between the EJTCR loop length and internal pressure with respect to the generation of a dense mass of solid carbon dioxide in relationship to pressure and temperature conditions on the carbon dioxide phase diagram. Referring to the figure, during expansion from gas-saturated liquid phase (A) a conventional snow cleaning nozzle produces a cleaning mixture (B) comprising a maximum of 50% solids and 50% cold vapor. Conventional snow spray cleaning mixtures tend to be very porous following expansion because the microscopic sized solid particles rapidly sublimate upon exposure to ambient conditions of temperature and pressure. Conventional snow sprays are controlled through the use of convergent-divergent nozzle designs By contrast, in accordance with the inventive device, a small quantity of gas saturated liquid is injected into a long thermally isolated and electrically grounded loop (called the EJTCR Loop herein) to produce a controlled dense mass of predominantly solid carbon dioxide (C). The EJTCR snow (called enhanced snow herein) generation process is directly controlled through loop length and diameter. For a fixed internal diameter of between 0.007 inches and 0.080 inches and varying the length of the loop from 0.1 to 10 meters (expansion volume from 5 ul to 30 milliliters), various relative densities of snow mass as described above can be produced. In general, for a fixed internal diameter and by elongating the expansion loop—variable densities can be produced. As shown in the Fig., long EJTCR loops result in a lower internal loop temperature and higher internal loop pressure—both favor solids generation.

The following is a more detailed description of an exemplary apparatus for performing the present invention based upon the above core structure.

Figure 2A:
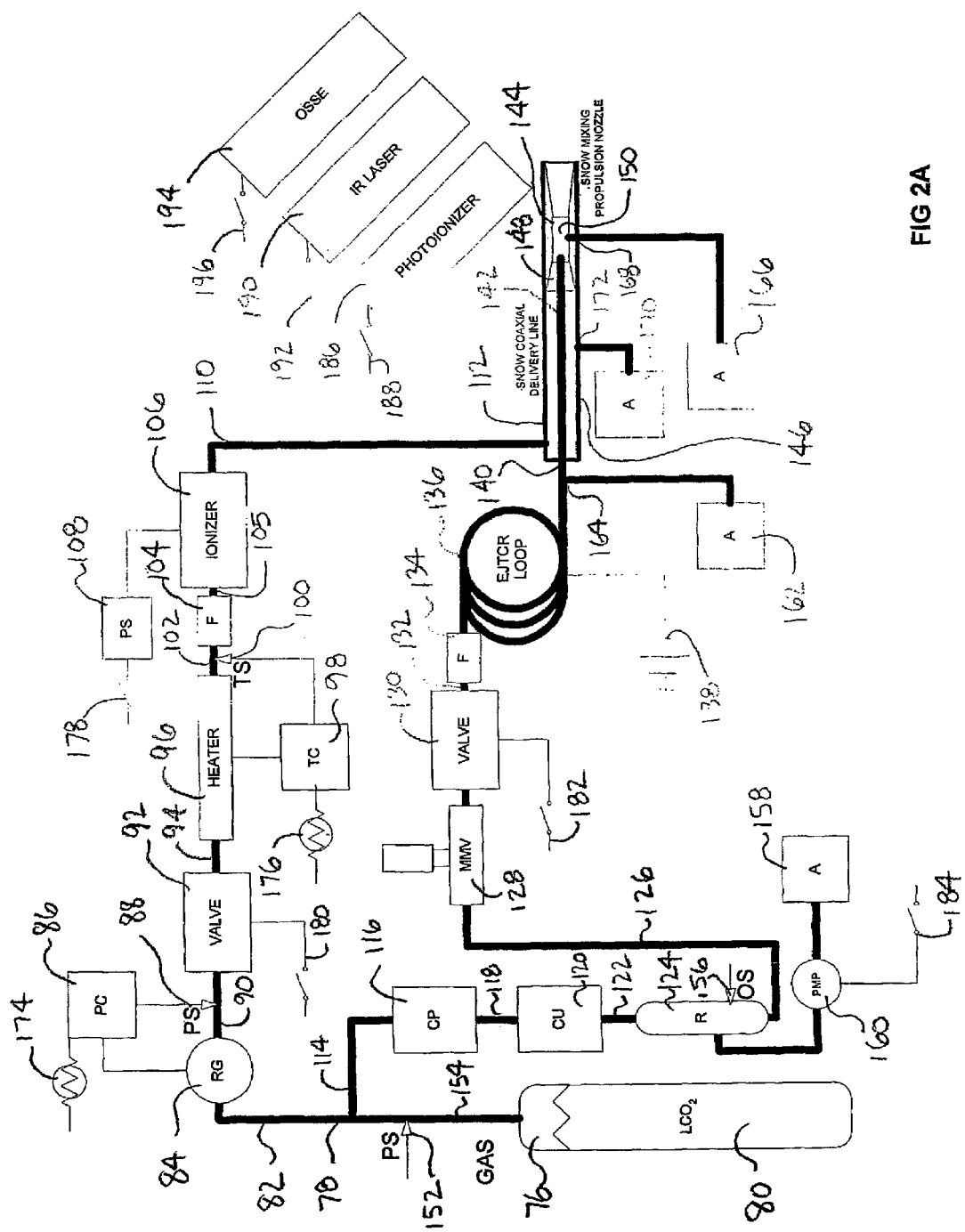
FIG. 2a is a schematic drawing of a dense fluid spray cleaning apparatus including an EJTCR loop in accordance with the invention.

Referring to FIG. 2*a*, a supply of carbon dioxide gas (76) is connected to a tee (78) which splits the gas stream into two high pressure gaseous streams. The carbon dioxide gas supply is derived from a supply of gas saturated liquid (80) held under a pressure of between 300 psi and 1000 psi and a temperature of between 0 F and 85 F. A pipe (82) feeds one fraction of the high pressure gas to a regulator (84) which is controlled using a pressure controller (86) and pressure sensor (88). Regulated carbon dioxide gas feeds from the regulator (84) via a feed line (90) into a valve (92). The valve (92) is connected via a feed line (94) which feeds pressure regulated carbon dioxide gas into a heater assembly (96). The heater assembly (96) comprises a temperature controller (98) and temperature sensor (100). The heater assembly (96) heats the pressure regulated carbon dioxide gas which feeds pressure regulated and heated carbon dioxide gas via feed line (102) into a particle filter assembly (104). The pressure regulated, heated and filtered carbon dioxide gas is fed via feed line (105) into an optional ionizer assembly (106) to create thermal ionized or thermal inert carbon dioxide gas. The optional ionizer assembly (106) comprises a tee. (not shown) containing an electrode (not shown) which is connected to power supply (108) which generates both positive and negative potential on the electrode. Pressure regulated, heated, filtered and optionally ionized carbon dioxide gas is fed via feed line (110) into a coaxial premix chamber (112).

A second fraction of unregulated high pressure carbon dioxide gas is fed via feed line (114) into catalytic purifier (116), available from M.O.S.T, Wisconsin. The unregulated high pressure and catalytic purified gas is fed via feed line (118) into a condenser unit (120) whereupon it is condensed, via heat transfer or pressure pump, from a gas phase into a liquid phase. In an alternative embodiment, not shown, the purified gas exiting the catalytic purifier (120) is further split into two streams—providing an ultrapure propellant gas supply for practicing the present invention. The purified liquid carbon dioxide is collected through condensing line (122) into a stainless steel reservoir (124). Purified liquid carbon dioxide is transferred via feed line (126) to a micrometering valve (128), which controls the feedrate through valve (130). Liquid carbon dioxide is fed from valve (130) via feed line (132) and through an in-line particle filter (134) into an enhanced joule-thompson condensation reactor (EJTCR) loop (136). The EJTCR loop may be constructed of various lengths and internal diameters of coiled PEEK tubing, which are coiled, wrapped in electrically conductive and grounded (138) shielding (not shown) and overwrapped in a suitable thermal insulation such as polyolefin shrink tubing (not shown). The end of the EJTCR loop is fed into and down the center of premix chamber (112) serving as a flexible inner snow tube (142) up to the mixing chamber (144). Optionally, the end of the EJTCR loop may be integrated to the beginning of the premix chamber (112) using a suitable connector (140) to change the PEEK connection into a rigid polished stainless steel snow tube (142).

The premix chamber (112) comprises an outer flexible or rigid propellant gas line (146) housing a centrally located flexible or rigid snow tube (142). The snow tube (142) may be wrapped in a grounded metallic shielding (not shown) to dissipate electrostatic charges from solid carbon dioxide flowing within the snow tube (142) and propellant gas flowing within the propellant gas tube (146). Alternatively, the propellant gas tube (146) may be wrapped in a grounded metallic shielding to provide beneficial electrostatic charge control. The propellant gas tube (146) is connected to the mixing chamber (144) wherein the snow tube (142) is inserted into the center of the mixing chamber (144).

The mixing chamber (144) comprises a convergent-divergent nozzle configuration wherein the snow tube (142) may be positioned to be within any position from the divergent section (148), the mixing section (150), or the divergent section (152) of the mixing chamber (144). Positioning the snow before the convergent section or after the divergent section causes the stream to be highly turbulent and unpatterned. The preferred position for the snow tube is within the mixing section (150) wherein structural changes can be made to both the convergent and divergent sections to optimize the pattern and thrusting of the. An example of a dynamically adjustable nozzle configuration is given in U.S. Pat. No., 154, which patent is herein incorporated by reference.

Two basic sensors are used to determine if 1) carbon dioxide supply problems exist and 2) purification system problems exist. A pressure sensor (152) located on the carbon dioxide gas supply line (154) and feeding the tee (78) is used to determine if the gaseous supply is depleted. An optical liquid level sensor (156) connected to the purified liquid carbon dioxide reservoir (124) determines if liquid is being condensed within the condenser unit (120).

Some embodiments additional include an injection system for incorporating additives. For example additives can be included into the liquid carbon dioxide stream. A purified liquid carbon dioxide additive injection system includes a source of additive (158) connected to the purified liquid carbon dioxide reservoir via an injection pump (160).

In other embodiments, an additive injection system (162) is integrated following the EJTCR loop using a tee (164). Suitable additives at this connection point also include alcohols, surfactants, gases, and the like. In still other embodiments, an additive injection system (166) is integrated into the mixing chamber (144) using a tee (168). Finally, an additive injection system (170) may be integrated into the propellant gas tube (146) using a suitable connection tee (172). Suitable additives at this connection point include alcohols, surfactants, gases, and the like.

Basic control systems for the present invention are also illustrated in FIG. 2a. Propellant gas pressure may be dynamically changed over time using a digital or analog input (174) to the pressure controller (86). Propellant gas temperature may be changed over time using a digital or analog input (176) into the propellant gas temperature controller (98). Similarly, the manual micrometering valve (128) may be replaced with a dome-loaded digital metering valve. An electronic switch (178) is provided to turn the optional propellant gas ionizer on and off. An electronic switch (180) is provided to turn on the flow of regulated carbon dioxide into the heater assembly (96). An electronic switch (182) is provided to turn on and off the injection of metered purified liquid carbon dioxide into the EJTCR loop (136) through the filter assembly (134). Finally, an electronic switch (184) is provided to the additive injection pump (160).

An additional embodiment of the present invention includes a method for preventing and eliminating electrostatic charges generated during contact of snow, with the substrate. Shown in FIG. 2a is a photoionizer (186) which is electronically turned on and off using an electronic switch (188). This embodiment directs photoelectrons at the cleaning target area, bathing the spray and substrate with ionizing photoelectrons. The photoelectrons ionize multiple interphases—gas-gas, solid-gas and solid-solid, destroying unbalanced electric charges in-situ and during creation.

Another embodiment of the present invention includes a diode laser (190) which is turned on and off using an electronic switch (192) and power controlled using a digitally controlled power supply (not shown). The diode laser provides coherent heating radiation to a spot (cleaning target) which is used in the present invention to enhance cleaning and serves as a combination of cleaning, welding, thermal curing and drilling tools.

Still another embodiment of the present invention includes a surface analysis device, such as an ultraviolet photoemission analyzer, to provide in-situ feed-back and control of the cleaning process. An ultraviolet radiation optically stimulated electron emission sensor provides surface cleanliness data which can be dynamically correlated to the various control parameters—pressure, temperature, snow injection rate and time. This capability provides an in-situ means of calibrating and validating the cleaning process. As shown in FIG. 2a, an OSEE sensor (194) is coupled to an on/off switch (196) and integrated with a spectroscopic analyzer (not shown) which provides feedback through software to the process control software.

Figure 2B:
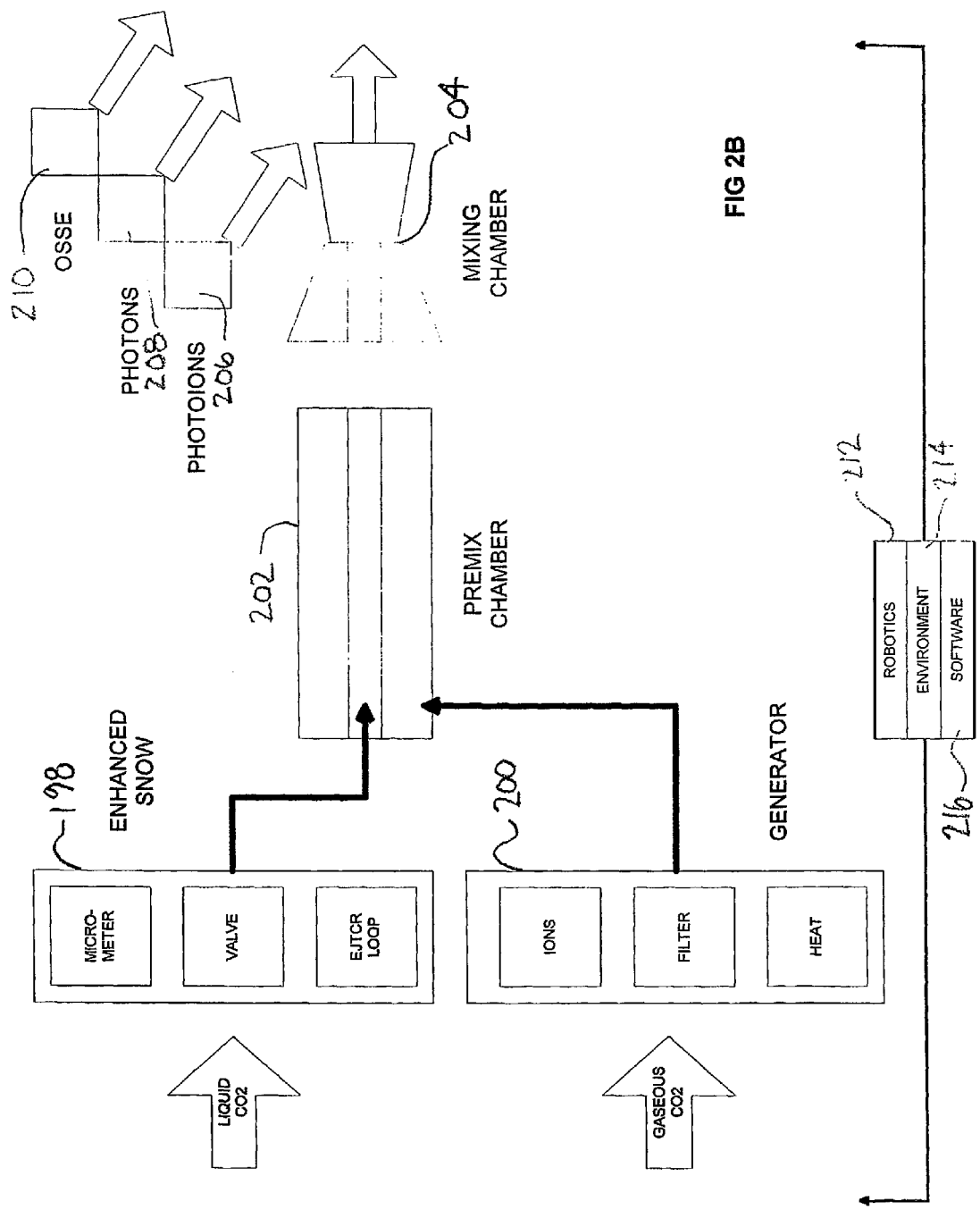
FIG. 2b is a block diagram illustrating various embodiments of the present invention.

FIG. 2b is a block diagram illustrating various embodiments of the present invention. This figure shows the EJTCR (198), the Thermal Inert/Ionized Gas Propellant Generator (200), the Premix Chamber (202) and the Mixing Chamber (204), along with a Photoionization System (206), a Diode Laser System (208), an Optically Stimulated Electron Emission Analyzer (210), a Multi-axis programmable robot system (212), a robotic environmental control system (214) and computer software (216).

Figure 3:
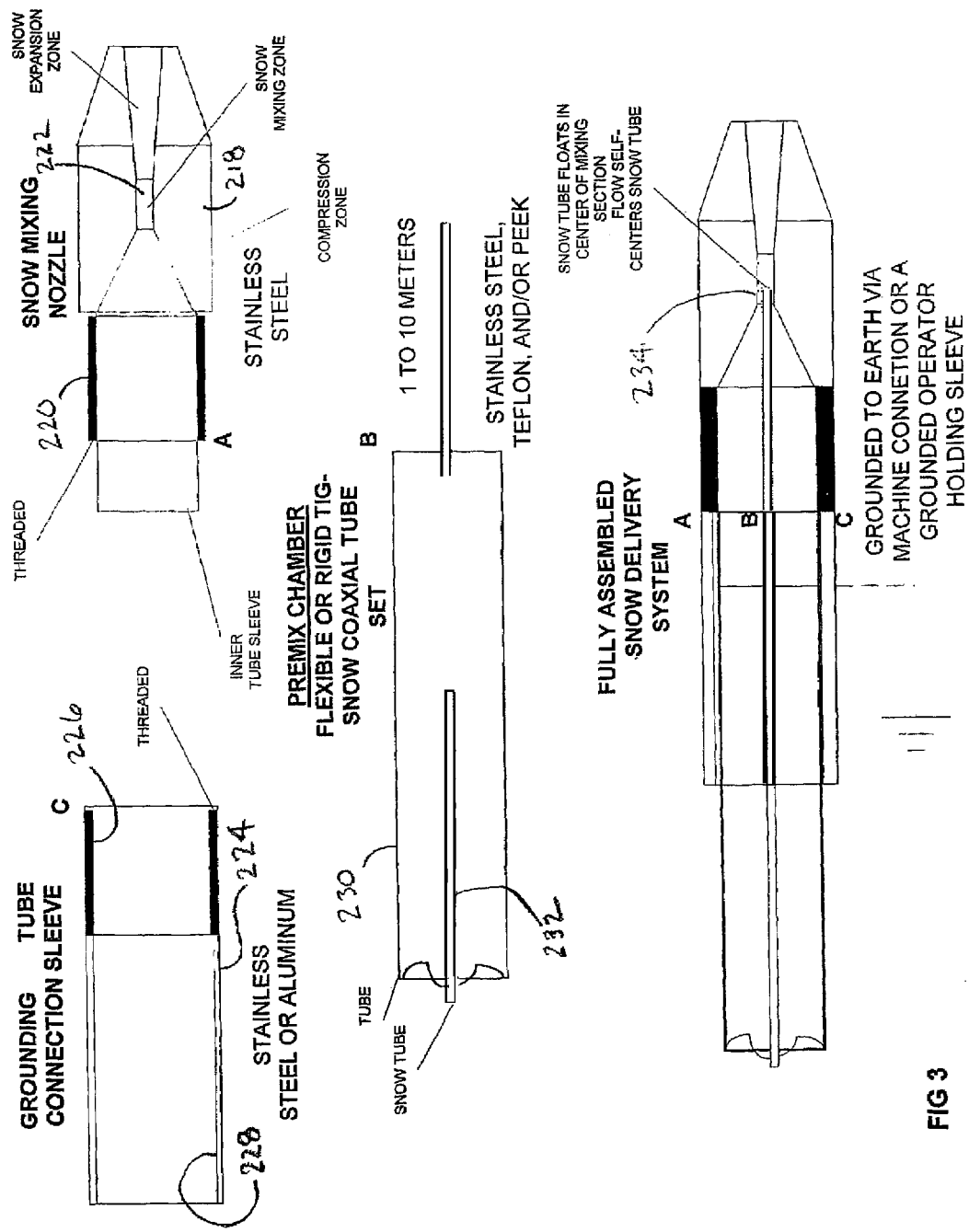
FIG. 3 is a cross-sectional view of a spray applicator for use in accordance with the present invention.

FIG. 3 shows an economical mixing applicator comprising three integrated components. The first component comprises a nozzle (218) having a rear threaded male section with a propellant tube sleeve (220) and a front convergent-divergent mixing nozzle (222). The second component is a propellant tube connection sleeve (224) having a threaded female connection and an elongated and tapered inner sleeve (228). The third component is the premix chamber comprising a flexible or rigid propellant tube (230) and a flexible or rigid Snow Tube (232). Assembly of the three components is shown in the figure and described as follows: The propellant tube (230) is pushed over the propellant tube sleeve on the mixing nozzle and located rear of the threaded section (220). The connection sleeve (224) is slid over the propellant gas tube and threaded to the mating male threaded section (220) of the mixing nozzle. This action causes the connection sleeve inner tapered wall (228) to compress over and grip the outside of the propellant gas tube. The Snow Tube (232) is slid into the center of the coaxial assembly and positioned within the mixing section (234) of the mixing nozzle (218). Once positioned within the mixing nozzle, the Snow Tube (232) is compressed using a suitable fitting at the entrance of the Premix Chamber (FIG. 2a, 140) to maintain its position.

Figure 4:
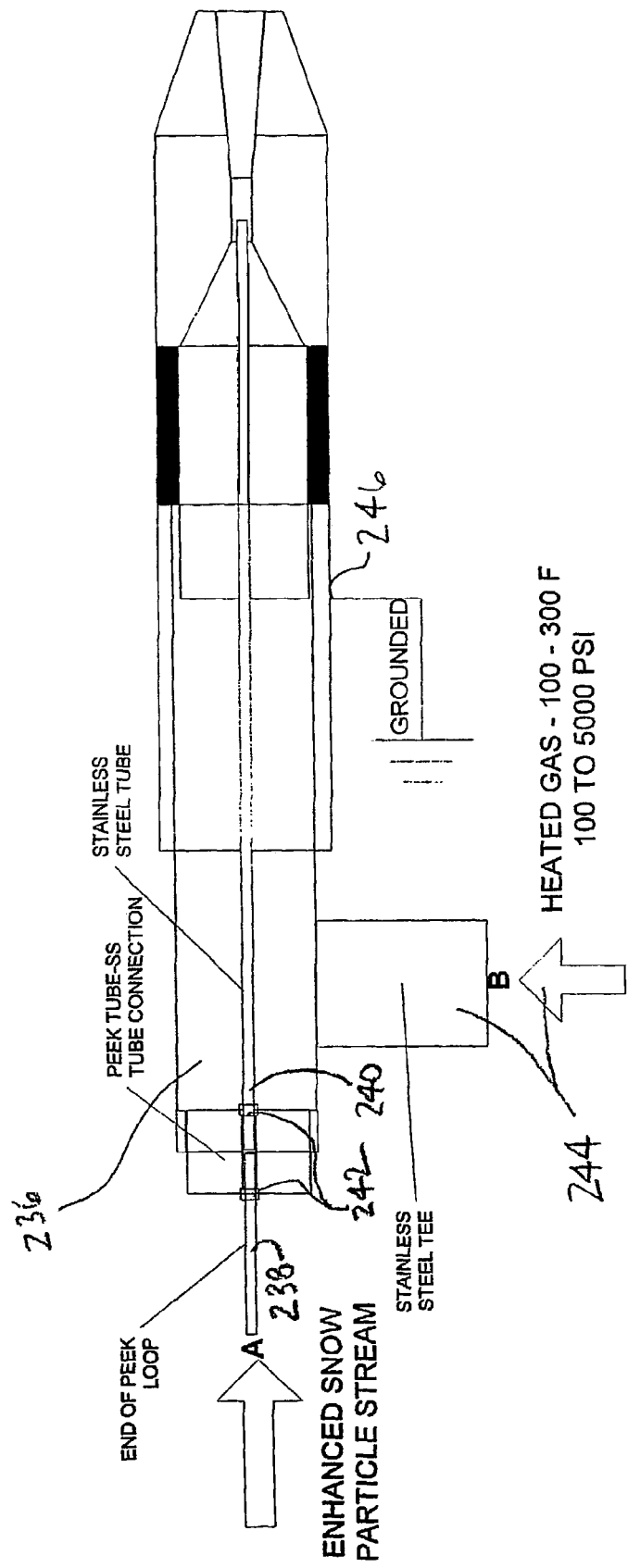
FIG. 4 is a cross-sectional view of a hypersonic spray applicator for use in accordance with the present invention.

FIG. 4 illustrates a hypersonic spray applicator for use with the present invention. This nozzle is designed for use with propellant gas pressures of between 100 psi to 5000 psi or more to produce the hypersonic spray. It is constructed of stainless steel and contains a tee section (236) wherein the PEEK Snow Tube (238), comprising the end of the EJTCR loop, is brought into and sealed to the tee section and mated to a section of stainless steel Snow Tube (240) using a pair of bulkhead compression fittings (242). High pressure propellant gas is fed into the tee (244) from the propellant gas generator (not shown). The body of the hypersonic spray applicator is grounded (246).

Figure 5:
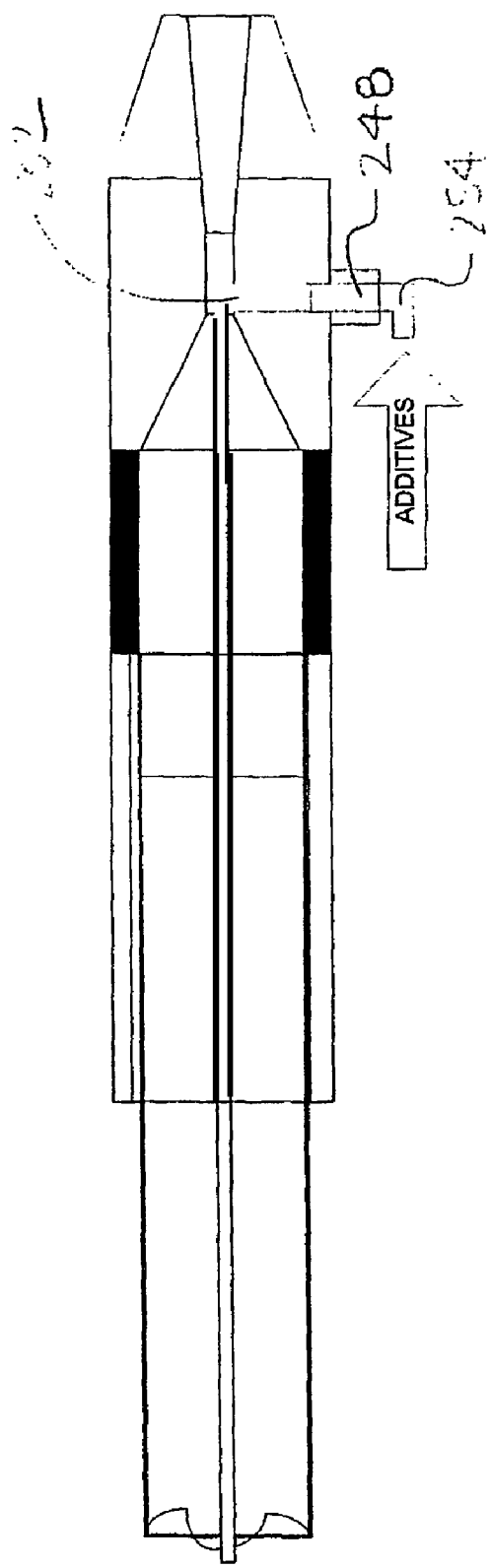
FIG. 5 is a cross-sectional view of an additive spray applicator for use in accordance with the present invention.

FIG. 5. illustrates an additive injection apparatus for use with the present invention. The propellant gas nozzle contains a small bore (248) extending through and into the entrance of the mixing section (250), at a 45 degree angled bore, through which a small PEEK or stainless steel injection needle (252) is inserted. During spraying operations, small amounts of liquids or gases are fed through the needle (252) into the mixing chamber.

FIG. 6. illustrates a conductive brush cleaning apparatus for use with the present invention. The nozzle contains conductive nylon bristles (254) concentrically positioned about the exit of an extended length mixing section (256). During spray cleaning operations, the brush assembly aids in dislodging large particles and residues while maintaining a ground through the spray applicator body (258).

FIG. 7 illustrates a fan spray cleaning apparatus for use with the present invention. The nozzle contains elongated and flattened divergent section (260) through which the stream is sprayed.

Figure 8:
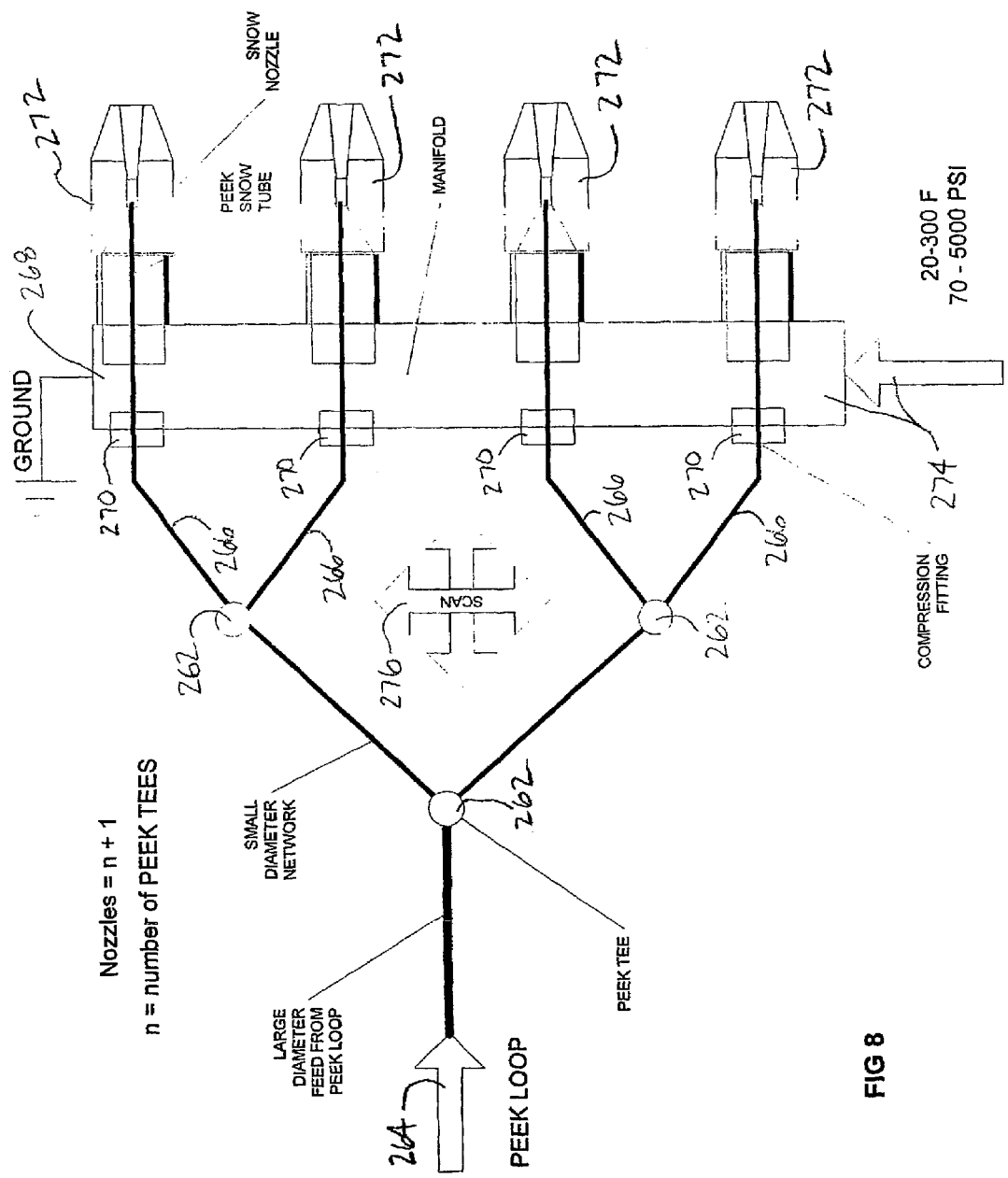
FIG. 8 is a schematic drawing of a multiple spray applicator assembly for use in accordance with the present invention.

FIG. 8. depicts a multiplexed spray assembly. PEEK tees (262) are used to split the enhanced snow stream fed from the EJTCR loop (264) into four individual Snow Tubes (266) which are fed into a multiported manifold (268) using a bulkhead compression fitting (270). Affixed to the manifold are four mixing nozzles (272) through which the Snow Tube is fed into the mixing sections. Propellant gas is fed into the manifold through a common port (274). Any number of spray heads can be developed as long as the feed diameter from the EJTCR loop is sized to provide an adequate feedrate through the individual snow tubes. The multiported spray applicator is useful for robotic and machine integration applications and produces a large cleaning pattern with only a small amount of movement in any direction (276).

FIG. 9 illustrates spray manipulator assembly for extending the spray applicator into hard to reach areas. The device comprises an adjustable mounting head (278), extension or telescoping shaft (280), and handle (282) with actuation trigger switch (284) and optional propellant gas (ionization) trigger switch (286). The manipulator is integrated with the generator through a flexible coaxial assembly (286).

FIG. 10. Illustrates a spray handgun assembly for manually holding and using the spray applicator. The assembly comprises a body (288) through which the spray applicator (290) is fed into and clamped. The handgun body contains a actuation trigger switch (292) and optional propellant gas (ionization) trigger switch (294). The handgun assembly is integrated with the generator through a flexible coaxial assembly (296).

FIG. 11 illustrates a photoionizer integrated with the applicator. As shown in the figure, the photoionizer (298) and spray applicator (300) are mounted on a common manifold (302). The manifold (302) contains a photoionizer pivot (304) and spray applicator pivot (306) for adjusting the alignment of each device with respect to the contact cleaning point on the substrate (308). The photon-cleaning manifold is connected to a multi-axis robot (not shown) using a robotic mount (310). Connecting the manifold to a multiaxis robot provides for any number of possible orientations and angles. The photoionizer is tunable to provide both spot and broad-spectrum substrate ionization—the robot provides the focusing control for both the spray applicator and photoionizer. Another feature shown in the figure is a spin processor (312). The spin processor holds the substrate under vacuum (314) via a vacuum chuck (316). The substrate is spun at a rotational velocity of between 20 and 5000 rpm. The photon-cleaning manifold is scanned from the interior (as shown) to the perimeter of the substrate while the substrate is spinning below. Software is used to control the pressure, temperature and photoionization process sequencing. In some embodiments the propellant gas pressure is decreased while the manifold moves from the interior region (lowest centripetal force) to the perimeter (highest centripetal force). Using this approach, the actual impact force (cleaning energy) of the particle stream is continuously decreased to compensate for the increasing centripetal force toward the perimeter -providing consistent cleaning energy across the entire substrate. Another feature is the ability to defocus the photoionizer to provide entire substrate ionization following cleaning and focused ionization during spraying to provide intense localized ionization. Finally, the photon-process is performed in a soft x-ray shielding box (318) to protect workers from exposure. X-Ray shielding can be most materials of suitable photon absorbing thickness such as 0.250 inch static safe clear acrylic.

The traditional ionization method uses air to deliver ions to an affected substrate. However this only works as a line-of-sight solution and the mechanics of cryogenic spray cleaning eliminates most line-of-sight ionization opportunities. In solid carbon dioxide spray cleaning, five tribocharging interfaces are present:
Interface 1: snow particle—snow particle
Interface 2: snow particle—gas molecules
Interface 3: substrate surface—snow particle
Interface 4: substrate surface—gas molecules
Interface 5: gas molecules—gas molecules Moreover, these tribocharging interfaces are three-dimensional and comprise various phases of matter—solids, liquids (condensed vapors and contaminants) and gases. Conventional ionization techniques manage one of two of the interfaces at best and do not manage all dimensions and phases present. For example in air ionization—the contacted surface is affected only and requires time to deliver the ions in sufficient concentration to neutralize electrostatic charges. In this example, the atmosphere above and down to the substrate is only affected. The snow stream, snow stream-substrate and backside interfaces of the substrate are not affected by air ionization. Grounding of non-conductors does not work.

Furthermore, as noted above, the cleaning of non-conductors with solid carbon dioxide produces many undesirable electrostatic effects—non-conducting substrates being cleaned charge unevenly with pockets of positive and negative charge, the solid carbon dioxide-gas particle mix is significantly charged prior to delivery to the substrate, the ensuing vapor cloud is highly charged. This also includes conductors which are ungrounded. All of these electrostatic events are occurring simultaneously during solid carbon dioxide spray cleaning operations. To date, the traditional techniques have been implemented, with the above-mentioned negative consequences. These problems are overcome by the inventive embodiments which provide a method and device for cleaning ESD/EOS sensitive electronic devices with sublimable cleaning agents, and more specifically solid carbon dioxide, without producing undesirable ESD.

Benefits of Combining Photons and Solid Carbon Dioxide:

Heretofore, photoionization has not been implemented in snow cleaning. This may be due to its cost and potential safety issues associated with soft x-ray radiation. Regardless, this has resulted in those skilled in the art not investigating the benefits of using x-rays in combination with solid-phase carbon dioxide during cleaning or cooling applications. This researcher has investigated the photoelectric-carbon dioxide combination and reports the following and previously undiscovered benefits of this unique combination:

1) Photoelectrons pass directly into and through the cryogenic solid spray matrix-creating ions in-situ through ionization of the gaseous carbon dioxide gas surrounding solid carbon dioxide particles. This effectively eliminates charge build-up during transport from the nozzle to the substrate.
2) Photoelectrons pass through substrate creating ions on the front surface (surface being cleaned) and back surface (surface not being cleaned). This prevents contaminants from passing around the substrate and sticking to the backside (a.k.a. electrostatic flypaper effect) during cleaning.
3) Photoelectrons pass through the atmosphere between the cleaning applicator and substrate and behind the substrate creating a virtual pool of ions within the carbon dioxide atmosphere, substrate and snow simultaneously. This eliminates charge build-up within the atmosphere contacting the substrate.
4) Unlike air ionization, the photoelectric ionization effect is enhanced by the motion of gas molecules within the photon beam. This is very beneficial since the solid carbon dioxide spray technique produces a very turbulent atmosphere.
5) The photoionization effect is 3-dimensional and is not effected by phases present, gas flow, temperature and humidity. The solid carbon dioxide-substrate-atmospheric system is fairly invisible to the photons and therefore do not hinder the ionization effect.
6) The photoionization effect works instantaneously upon the submicron particles held on surfaces, delivering significant energy to the surface-particle region—breaking strong electrostatic energy bonds instantly.
7) During application of snow particles—the contact interface where the particle meets the substrate is continuously bombarded with ionizing radiation (the radiation passes through the snow particle). This eliminates the tribocharging effect during creation. This provides a photoelectric antistatic agent at the solid particle-substrate interface without chemical contamination.
8) The photoionization effect with the device can be tuned to work on all shapes, sizes and compositions of substrates—the photoionizer produces a 120 degree cone of ionization. The closer the photoionizer, the more focused and faster the ionization effect (higher density of photons). During sublimable spray operations, the photoionizer is focused (small area radiation) primarily on the contact zone. During pre- and post-cleaning operations, the photoionizer is in a defocused (large area radiation) orientation.

Turning to FIG. 12, there is shown a diode laser integrated with the applicator The diode laser (320) and spray applicator (322) are mounted on a common manifold (324). The manifold (324) contains a diode laser pivot (326) and spray applicator pivot (328) for adjusting the alignment of each device with respect to the contact cleaning point on the substrate (330). The cleaning manifold to connected to a multi-axis robot (not shown) using a robotic mount (332). Connecting the manifold to a multiaxis robot provides for any number of possible orientations and angles as shown graphically. The diode laser is tunable to provide both spot and broad-spectrum substrate heating—the robot provides the focusing control for both the spray applicator and diode laser. Another feature shown in the figure is a spin processor (334). The spin processor holds the substrate under vacuum (336) via a vacuum chuck (338). The substrate is spun at a rotational velocity of between 20 and 5000 rpm. The laser cleaning manifold is scanned from the interior (as shown) to the perimeter of the substrate while the substrate is spinning below. Software is used to control the pressure, temperature and diode laser process sequencing. One possible process using the present embodiment involves decreasing propellant gas pressure while the manifold moves from the interior region (lowest centripetal force) to the perimeter (highest centripetal force). Using this approach, the actual impact force (cleaning energy) of the stream is continuously decreased to compensate for the increasing centripetal force toward the perimeter—providing consistent cleaning energy across the entire substrate. Another process involves using the diode laser to preheat the entire substrate at a defocused distance above the substrate. The robot then moves the entire applicator manifold to the focused position for intense lasing during cleaning. Finally, the photon-process is performed in a laser shielding box (340) to protect workers from exposure. Laser shielding may be constructed of many materials having suitable IR laser absorbing/reflecting properties such as stainless steel or specially coated polymers and glasses.

The preferred wavelength for the diode laser used in the present embodiment is about 940 nm. This wavelength is invisible to solid carbon dioxide, allowing the snow spray cleaning operation to be performed simultaneous with the lasing operation with no impact on either applicator's performance. When used during snow cleaning, the near infrared laser operates predominantly on the substrate at the snow cleaning contact point and above—water vapor on and within atmosphere above the contact point. Moreover, the snow spray is an excellent coolant for the laser, preventing overheating of delicate substrates.

Combining cleaning with many industrial, semiconductor, microelectronic or disk drive manufacturing processes dramatically minimizes production times, superior process control, reduces consumables costs, and eliminates the need for separate production equipment such as soldering systems, stripping systems, curing ovens, thermal treatment systems, cool-down times and adhesive application systems. Representative processes include:

cleaning to pretreat substrates prior to Laser microwelding of metals.
cleaning to pretreat substrates prior to application of adhesive prior to Laser thermal cure.
cleaning to pretreat substrates prior to Laser soldering.
Laser-induced pyrolysis of coatings prior to ablation to reduce stiction or adhesion.
Laser-induced excitation of boundary layer particles prior to ablation to reduce intermolecular adhesive force.
Laser-induced heating during cleaning to prevent substrate cooling.
Laser-induced heating prior to or following cleaning.
Laser drying of wet substrates prior to cleaning.
Laser removal of demarcations prior to cleaning.
Simultaneous cooling during soldering or joining to protect sensitive components from heat.
providing a rapid cooling following thermal joining.
Laser wire stripping and cleaning.

Advantages of this inventive embodiment include:
Multiple integration options—cleaning, cutting, soldering, joining curing and cooling.
Fiber optically coupled diode laser does far less collateral damage as compared to Xenon Flash lamp-Pellet approaches such as in the Boeing Flashjet Approach.
Designed for microelectromechanical applications as compared to the Boeing FlashJet approach (removal of coatings from aircraft wings and bodies using a flashlamp and low velocity pellets). cleaning applies to cleaning miniature surfaces such as head-gimbal assemblies (HGAs), quartz sensors, fiber optic lenses and quartz resonators.
Laser is generally line-of-sight cleaning for planar substrates under highly controlled conditions, such as the Radiance approach, while the Diode Laser-approach can be applied to much more complicated topography with a generally less controlled approach. Diode lasers are not wavelength specific and provide a general purpose intense heat source. There is no need for focusing lenses, steering mirrors and the customized and complex and system/application-specific configurations (tooling) necessary for each type of substrate. The present invention teaches the use of robotic focusing (working distance to substrate) to control energy delivery.
Moreover, ultraviolet excimer lasers (KrF—248 nm), C02, and Nd:YAG lasers used by the Radiance system are used to produce photon flux to break bonds holding contaminants which are then swept away in a laminar gas flow stream above the substrate.
Compact size, high efficiency, low cost in mass production, high-power, fiber-coupled, diode laser arrays are a very good alternative to $CO_2$ and Nd:YAG lasers in laser material processing applications.
Coupling the systems to a 5-axis robot and software provides an articulated and integrated production tool. Packaging this production tool in a minienvironment provides a microcontamination-free production tool. Multi-axis robots manage the substrates providing a completely automated (lights-out) production tool.
Combining LASER and dry cleaning technologies provides an alternative to expensive and hazardous alternatives. This process eliminates water in the cleaning process that can be several 100 gallons of expensive deionized water of approximately 2000 gallons used in typical semiconductor wafer production cycle. The present embodiment also eliminates reprocessing and disposal costs, eliminates the need for alcohol drying and eliminates secondary reactions such as oxidation, ionic contamination, corrosion and bacterial growth.
The inventive embodiment removes contaminants that cannot be removed using conventional snow cleaning techniques.

This inventive embodiment simultaneously heats a substrate during cleaning which prevents a thin film of water ice from forming on the surface of the substrate—encapsulating contaminants in a 300 psi tensile strength sheet of ice. Furthermore, the substrate exits the process at or above ambient temperature which prevents re-deposition of vapor phase and particulate contaminants.

Referring to FIG. 13, there is shown a robot-based integrated cleaning system and process simultaneously using the spray cleaning, laser heating and photoionization embodiments of the present invention. As shown in the figure, the substrate to be cleaned is a semiconductor wafer (342) mounted on a spin processor (344). The wafer is spun to a speed of between 50 and 5000 rpm. The integrated cleaning tool comprises a diode laser tense (346) which is fiber optically connected to a infrared laser light generator and controller (not shown), a Snow spray applicator (348) which is connected coaxially connected to a generator (not shown), and a photoionization device (350) which connected to a photoionization power supply (not shown). The integrated cleaning tool is further integrated on a common manifold (352) which is connected via a robotic mount (354) to a cartesian robot (not shown). In Step 1 as shown, the integrated cleaning tool is robotically positioned above the substrate at the center of the substrate in the defocused position (356) wherein the diode laser beam is turned on and is irradiating a broad section of the spinning substrate with infrared radiation (360). The photoionization device is also turned on and is irradiating a broad section of the substrate with ionizing photons (362). In Step 2 as shown, the integrated cleaning tool is positioned in a focused position at the center of the substrate (364). In this position, both the diode laser beam (366) and photoionization beam (368) are in the highly energetic focused position. In Step 3 as shown, the substrate is scanned from the center (370) to the perimeter (372) any number of times to prepare the substrate for cleaning by drying, heating and ionizing the substrate. The temperature of the substrate may be preheated to any temperature between 20 C and 300 C during this substrate preparation step. A described herein, the use of the diode laser is varied and can be for drying substrates, heating substrates, welding or joining. In this particular example, the laser is used to remove water and preheat the substrate. In Steps 4 and 5 as shown, the spray applicator is turned on (374) and all three devices are used simultaneously to clean the substrate any number of times by scanning from the center (376) to the perimeter (378) of the spinning substrate. In Step 6, the spray is stopped, leaving the diode laser and photoionizer on, whereby in Step 7 the integrated cleaning tool is repositioned above the center of the substrate in the defocused position (380) using the robot (not shown). In Step 8, the integrated tool is scanned in the defocused position from the center (382) to the perimeter (384) of the spinning substrate to heat the substrate above ambient temperature. In Step 9, an infrared thermometer (386) is used to determine the temperature endpoint for Step 8. The substrate is dry, clean, ionized and hot (388) following Steps 1 through 9.

Figure 14:
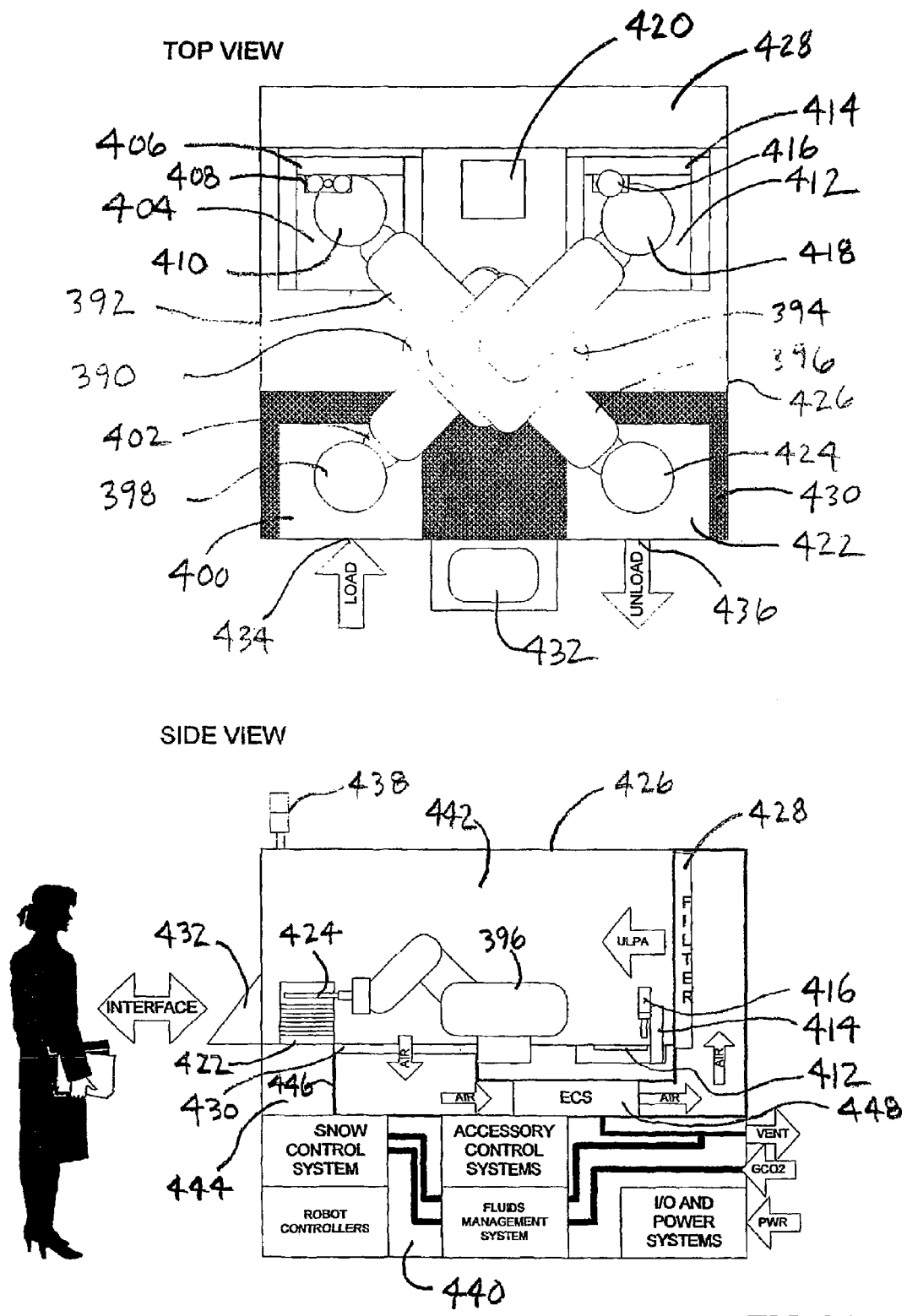
FIG. 14 is a top and side schematic drawing illustrating an environmentally controlled robotic cleaning and inspection workstation for use in accordance with the present invention

FIG. 14 shows a robotic cleaning workstation in accordance with the present invention. As shown in the figure, Top View, the robotic cleaning workstation contains a multiaxis substrate transfer robot, such as a Mitsubishi RV-M2, at the center and shown in four positions—loading platform position (390), cleaning platform position (392), inspection platform position (394) and offloading platform position (396). Dirty substrates are loaded into the loading platform position, a door is closed (not shown), and the transfer robot picks up a substrate (398) from a fixture (400) located in the loading zone using an end-effector (402) such as a vacuum grip. The substrate is then transferred to the cleaning platform and placed onto a vacuum spin processor (404) that is integrated to a cartesian robot (406) such as a Sony DeskTop Robot. The cleaning applicator—a manifolded diode laser, spray applicator and photoionizer (408)—is affixed to the cleaning robot and can be moved in any Cartesian direction X-Y-Z and the manifold can be rotated from any offset angle from 0 to 45 degrees from normal over the spinning substrate (410). The substrate cleaning process described above using FIG. 13 is then performed. Following cleaning, the transfer robot picks up the substrate and transfers the substrate to the inspection platform (412). The inspection platform comprises an inspection robot (414) such as a Sony Desktop Robot that is integrated with the OSSE surface analysis sensor (416) embodiment. The inspection robot can be moved in any cartesian direction X-Y-Z and the inspection sensor can be rotated from any offset angle from 0 to 45 degrees from normal over the substrate (418). The inspection sensor (416) is used to scan the substrate surface at a predetermined distance and surface inspection pattern to discern molecular contamination remaining following cleaning. Alternatively, the inspection sensor may be a video camera for visual inspection of substrate features. Following inspection, data gathering and analysis, the substrate cleanliness is either accepted or rejected using computer analysis software. Unacceptable cleanliness requires the substrate (418) to be recleaned. The transfer robot picks up the substrate and places the substrate onto a holding platform (420) if the cleaning platform (404) is occupied with another substrate, or returns the substrate back to the cleaning platform for recleaning. Following inspection and acceptance, the transfer robot picks up the substrate (418) and transfers the substrate to the offloading platform (422) where the cleaned and inspected substrates (424) are collected for unloading from the workstation.

Also shown in the Top View of FIG. 14 are the basic design features of the workstation. These include a fully enclosed housing (426) constructed of stainless steel, acrylic or other suitable materials for using the present embodiments—1) safe-guarding workers from exposure to x-rays, laser radiation and carbon dioxide gas and 2) safe-guarding the cleaning environment within the enclosure from external environmental elements such as moisture and particles. The workstation contains a vertical laminar flow ULPA filtration system (428) and a raised floor grating (430) for recirculating internal atmosphere. A computer console (432) is affixed to the outside of the workstation for operator input and cleaning process output. The computer console contains a means for programming the various robots used in the present embodiment and for inputting cleaning and inspection criteria. Finally, a printer (not shown) may be integrated with the computer console for producing printed reports following each completed cleaning process cycle. Substrates are fed into the workstation using a loading dock (434) which may contain a sliding door (not shown) and substrates are withdrawn from the workstation using an unloading dock (436) which may contain a sliding door (not shown).

Shown in the Side View of FIG. 14 are above-described and additional features of the workstation. A lightstack assembly (438) is used to provide a visual operational status for the workstation (i.e., Red-Operating, Green-Not Operating). All satellite systems including the Cleaning System, Robot Control Systems, Fluids Management System, Accessory Control Systems and Input/Output and Power Control System are located within a control bay (440) located in the lower hemisphere of the workstation and isolated from the cleaning and inspection bay (442) located in the upper hemisphere of the workstation. Fluid input (gaseous carbon dioxide), ventilation duct and electrical power connections are made toward the rear of the control bay as shown in the figure. An atmospheric management bay (444) located in the central hemisphere of the workstation integrates the floor grating (430) via a common ducting system (446) to an environmental control system (448) and the ULPA filter system (428). As shown in the figure using arrows, the internal workstation atmosphere is recirculated from the cleaning and inspection bay (442) down through a raised floor grating (430), into the environmental control system (448), into the ULPA filter system (428) and back into the cleaning and inspection bay (442). The environmental control system (448) comprises a regenerating gas dryer (i.e., metal oxide) and heater (both not shown). Using a thermometer and humidity sensor (both not shown) located within the cleaning and inspection bay, the environmental control system maintains the cleaning and inspection bay temperature and humidity at predetermined settings. During regeneration operations, the gas dryer is heated to 200 C and dry carbon dioxide gas is used to purge moisture from the dryer which is vented from the workstation. Optionally, the ULPA filter system (428) may contain ionization bars (not shown) affixed to the downstream side of the filter to provide internal ionization of the cleaning and inspection bay.

The entire cleaning process performed within the workstation is automated and controlled using system software in combination with a PC or PLC, various electronic switches, digital controlled pressure and temperature controllers, a robot, a photoemission inspection system and laser system. The system software is written for Visual Basic operating on a Windows NT and using an Allen Bradley PLC controller. The present system software embodiment teaches in-situ correlation between photoemission analysis and cleaning performance with automatic snow pressure and temperature adjustments. The system software also teaches an internet-based preventive maintenance code block within the software to perform remote system diagnostics and repair.

Figure 15:
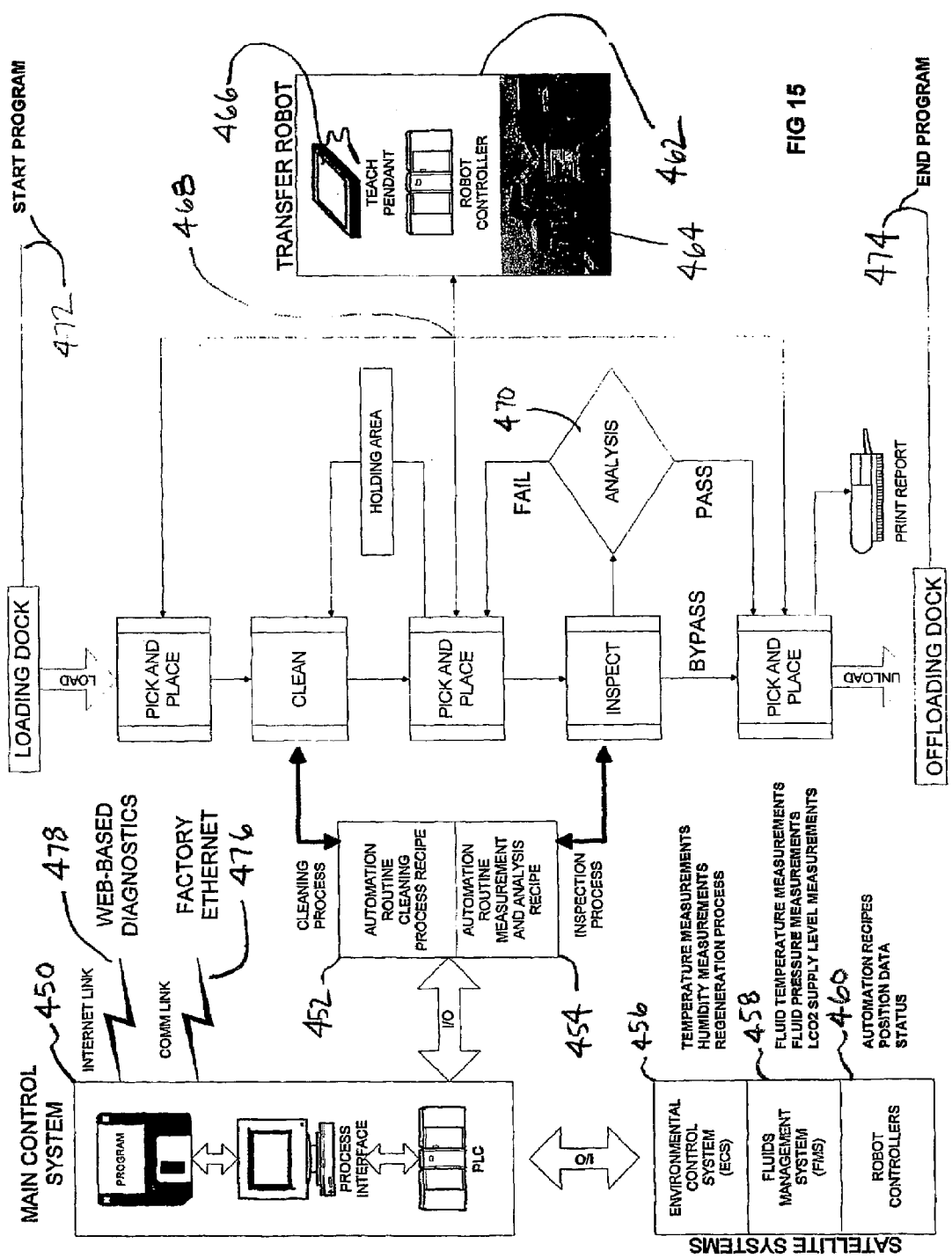
FIG. 15 is a schematic drawing illustrating architecture for automatically controlling a robotic substrate cleaning process, inspection process and associated environment using a computer/PLC and software.

FIG. 15 shows the computer and software-based control system architecture for automatically operating the various embodiments of the present invention. A main control system (450) comprising a central computer system, programmable logic controller and software is used to provide all input-output management of the cleaning process and system (452), inspection process and system (454), environmental control system (456), fluids management system (458) and robot controllers (460). The robot controllers include the transfer, cleaning and inspection robots. The robots each have typically three components. For example the transfer robot system (462) comprises 1) a teach pendant to teach positions to the robot to execute the four pick and place operations within the workstation, 2) a robot controller to store taught positions and to interface with the main control system (450) and 3) a multiaxis robot containing an vacuum grip end-effector (464)

or in the case of the cleaning and inspection robots—cleaning and inspection end-effector tools.

Operational software is used to manage and operate the various systems described herein. The computer software displays a graphical interface to the user, accepts inputs for a variety of process parameters and displays various system outputs.

Below are exemplary process inputs:

Cleaning Process Parameters:
  EJTCR Injection Feedrate
  Propellant Gas Temperature
  Propellant Gas Pressure
  Ionization Power Supply
  Pulsed or Continuous Operation
  Pulse Rate
  Additive Injection
  Additive Injection Feedrate
  LASER System
  LASER Pointer
  LASER Power
  Photoionizer System
  Spin Processor System
  Spin Processor Speed
  Print Report (Yes/No)

Transfer Robot Parameters—Pick and Place Operational Recipes:
  Load—Clean Positions
  Clean—Inspect Positions
  Inspect—Reject Positions
  Reject—Clean Positions
  Inspect—Unload Positions
  Grip/Ungrip Positions
  Transfer Speed Cleaning Robot Parameters—Manifold Operational Recipes:
  Starting Position(s)
  Ending Position(s)
  Focused Position(s)
  Defocused Positions(s)
  Offset Angles(s)
  Scanrate
  Number of Scans Inspection Robot Parameters—Sensor Operational Recipes:
  Starting Position(s)
  Ending Position(s)
  Focused Position(s)
  Defocused Positions(s)
  Offset Angles(s)
  Scanning Rate
  Number of Scans
  Acceptance/Rejection Criteria
  Print Report (Yes/No)
  Below are exemplary process outputs:

Stream System:
  Fluid Temperatures
  Fluid Pressures
  Fluid State (Gas/Liquid)
  System Status Robot Systems:
  Cartesian Space Positions
  Robot Status
  Grip Status
  Speed
  Sequence Environmental Control System:
  Temperature
  Humidity
  Regeneration Sequences Fluids Management System:
  Temperature
  Pressure Phase
  Supply Level (Optical Sensor)

Inspection System:
  Analysis and Results

Using the transfer robot system (462) and teach pendant (466), the user teaches the transfer robot the substrate transfer operations which move the substrate from the load position, through the cleaning and inspection positions (and holding position), and finally to. the unload position—called pick and place operations (468). Following this, the user inputs the leaning process parameters (452) and inspection process parameters (454) given above into the computer, including pass/fail analysis criteria (470) for the inspection process. Following this, the user has constructed a cleaning process recipe which can be saved as a unique process filename for future reference and repeatability. The program may then be started (472), whereupon the entire cleaning process recipe, including robotics, cleaning and inspection criteria, is executed sequentially until completion (474).

Finally, the system software is designed with capability to communicate to a factory process management system through an Ethernet connection (476). Moreover, the software is designed to allow a service support technician to remotely diagnose system operation and function over the internet (478).

Figure 16:
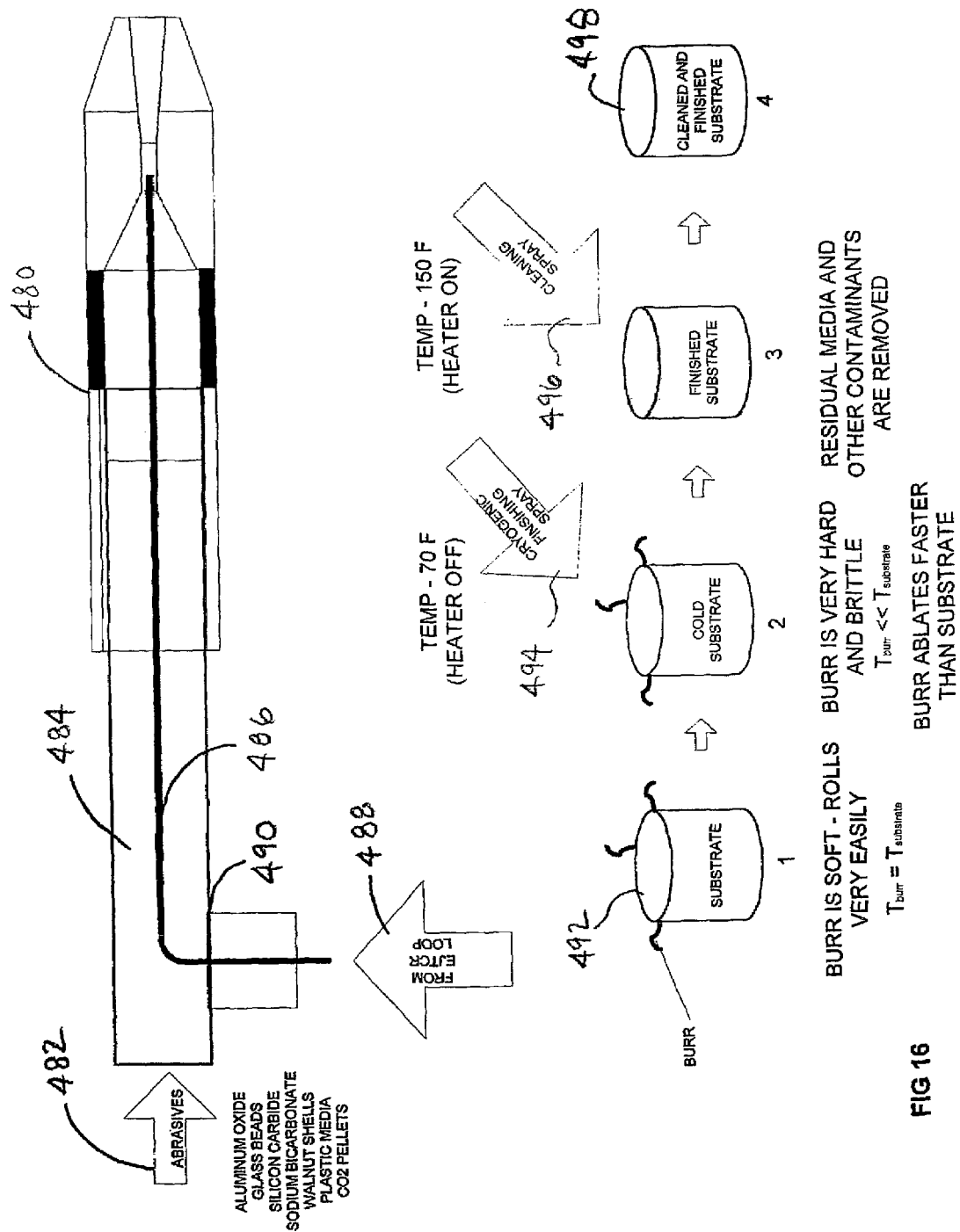
FIG. 16 is a schematic drawing illustrating a cryogenic microabrasive surface finishing apparatus and process in accordance with the invention.

FIG. 16 shows the cryogenic microabrasive surface finishing apparatus and process embodiment of the present invention. Machined or molded polymeric substrates often contain plastic burrs around various edges and surfaces. Removal of burrs using conventional deburring using microabrasives does not always produce an acceptable surface because the burr tends to fold over during ablation. The present process provides a means for producing ultrafine abrasive finishing by supercooling the burr, with respect to the substrate, thereby making the burr hard and brittle. Impact by an abrasive under these conditions produces a clean and fast separation because the burr temperature drops much faster than the substrate temperature.

The cryogenic abrasive finishing apparatus consists of a abrasive cleaning applicator (480) with the propellant gas supply (482) containing microabrasives fed down the coaxial delivery line (484). Dense snow particles are fed down a centrally located snow tube (486) from the EJTCR loop (488). The two streams are integrated at a distance from the abrasive cleaning applicator (480) using a tee connection (490). Any number of abrasives as shown may be employed in the present embodiment.

The abrasive cleaning process is performed as shown and described as follows. A substrate containing small edge burrs (492) is showered with an abrasive spray stream (494), with the propellant gas heater turned off. Following this, the propellant gas heater is activated and the microabrasive injection device (not shown) is deactivated—showering the substrate with a cleaning spray stream (496). The substrate (498) is now finished and clean.

The present invention provides capabilities not found in conventional snow cleaning technology. The following is an cleaning and production application wherein the present invention is used to provide integrated multiple cleaning operations during assembly, provide a thermal curing process and dynamically alter snow spray cleaning energy during application where the substrate contains mechanically sensitive features that require the cleaning spray to have a lower spray pressure in one area and possibly an increased cleaning spray energy in other areas. The following example is only one of many integrated substrate cleaning, production and assembly operations possible using the present invention.

Figure 17:
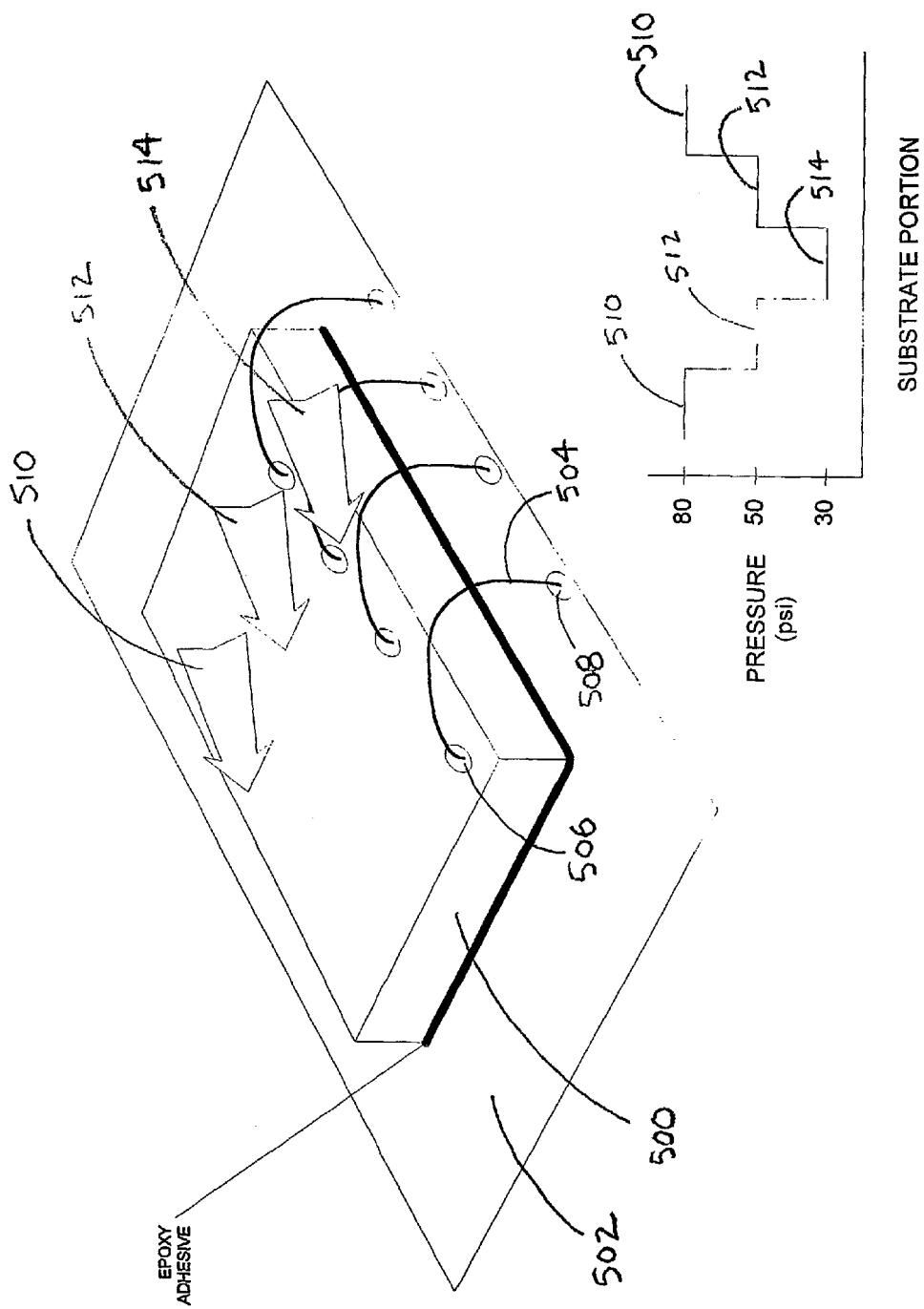
FIG. 17 is a schematic drawing illustrating use of dynamic pressure control during a substrate cleaning operation

As shown in FIG. 17, the substrate—a small electronic chip or die (500)—is electrically connected to an electronic module (502) using any number of microscopic wires (504). The die is placed onto the electronic module and bonded into place. The spray cleaning processes of the present invention are used to clean the bonding surfaces of module (502) for the initial die placement and bonding operation. Following the initial die placement, microscopic wires (504) are placed—joining the electronic connections on the die (506) to the electronic connections on the module (508). In the application, the interconnection bonding surfaces are cleaned using the present invention prior to dispensing a small droplet of a heat curing conductive adhesive (i.e., silver-filled epoxy). Following cleaning and adhesive placement, the small wires are robotically placed into each epoxy solder joint Following this, the diode laser embodiment of the present invention is used to rapidly and thermally cure the epoxy joints. A final spray cleaning is performed using the present invention to remove any residual particles following die bonding, adhesive placement, wire bonding and curing operations and prior to lid placement. The spray pressure is dynamically controlled to produce a much lower spray pressure in the regions near the wires. As shown in the figure, the spray pressure is decreased from 80 psi (510), to 50 psi (512) and finally to 30 psi (514) as the spray applicator (indicated as arrows) approaches the mechanically sensitive wire bonding areas.

The invention claimed is:

1. A dense fluid spray cleaning apparatus for producing a stream containing a solid particulate comprising:
   a dense fluid propellant generator fluidly connected to a dense fluid supply for producing a heated, dense fluid propellant;
   an Enhanced Joule-Thompson Condensation Reactor fluidly connected to a dense fluid supply for producing a solid particulate from the dense fluid;
   a premixer for indirectly mixing the heated, dense fluid propellant received from the propellant generator and the solid particulate received from the enhanced Joule-Thompson Condensation Reactor, the premixer including inner and outer coaxial tubes, the inner coaxial tube in fluid connection with the Enhanced Joule-Thompson Condensation Reactor and the outer coaxial tube in fluid connection with the dense fluid propellant generator; and
   a mixer for directly mixing the heated dense fluid propellant and the solid particles received from a premix chamber to produce a stream containing the solid particulates.

2. The apparatus of claim 1 wherein the dense fluid propellant generator includes a dense fluid ionizer.

3. The apparatus of claim 1 wherein the Enhanced Joule-Thompson Condensation Reactor includes a spray nozzle and a loop, such that the spray nozzle injects dense fluid received from the dense fluid supply into the loop.

4. The apparatus of claim 3 wherein the loop has a length of from about 6 inches to about 20 feet, an outer diameter of from about 1/32 inch to about 1/8 inch, and an inner diameter of from about 0.0025 inch to about 0.80 inch.

5. The apparatus of claim 3 wherein the loop has a length of from about four feet to about five feet, an outer diameter of from about 1/32 inch to about 1/8 inch, and an inner diameter of from about 0.02 inch to about 0.80 inch.

6. The apparatus of claim 3 wherein the loop is made of polyetheretherketone tubing.

7. The apparatus of claim 6 wherein the polyetheretherketone tubing is first overlapped with a grounded conductive shielding and then overlapped with a thermally insulative material.

8. A method for producing a spray cleaning stream containing a solid particulate formed from a dense fluid comprising:
   producing a heated, dense fluid propellant;
   producing the solid particulate from a dense fluid using an Enhanced Joule-Thompson Condensation Reactor;
   indirectly mixing the heated, dense fluid propellant and the solid particulate in a premix chamber having inner and outer coaxial tubes, the inner coaxial tube for transporting the solid particulate and the outer coaxial tube for transporting the dense fluid propellant; and
   directly mixing the heated dense fluid propellant and the solid particulate received from the premix chamber to produce the spray cleaning stream containing the solid particulate.

9. The method of claim 8 wherein the solid particulate is made of carbon dioxide.

10. The method of claim 9 wherein the dense fluid propellant has a temperature of from 70 F. to 300 F.

11. The method of claim 9 wherein the dense fluid propellant is ionized.

12. The method of claim 9 wherein the dense fluid propellant contains a solid abrasive.

13. The method of claim 9 wherein the solid particulate has a size from 100 micrometers to 0.2 micrometers.

* * * * *